United States Patent [19]

Imai et al.

[11] Patent Number: 5,521,032
[45] Date of Patent: May 28, 1996

[54] EXPOSURE MASK AND METHOD OF MANUFACTURE THEREOF

[75] Inventors: Akira Imai, Hachioji; Norio Hasegawa, Hinodemachi, both of Tokyo, Japan

[73] Assignee: Hitachi, Ltd., Tokyo, Japan

[21] Appl. No.: 337,428

[22] Filed: Nov. 8, 1994

Related U.S. Application Data

[62] Division of Ser. No. 19,889, Feb. 19, 1993, Pat. No. 5,391,441.

[30] Foreign Application Priority Data

Feb. 21, 1992 [JP] Japan .................................. 4-34740
Mar. 24, 1992 [JP] Japan .................................. 4-65747

[51] Int. Cl.[6] ................................................ G03F 9/00
[52] U.S. Cl. ........................... 430/5; 430/311; 430/323; 430/324
[58] Field of Search ........................ 430/5, 323, 324, 430/311

[56] References Cited

U.S. PATENT DOCUMENTS 5,254,418  10/1993  Kamon et al. .............................. 430/5
5,272,024  12/1993  Lin ........................................... 430/323

FOREIGN PATENT DOCUMENTS 2-4854  2/1990  Japan .

OTHER PUBLICATIONS

"Improving Resolution in Photolithography With a Phase–Shifting Mask", IEE Transactions on Electron Devices, vol. ED–29, No. 12, Dec. 1982, Levenson, et al.
"Optical/Laser Microlithography IV", SPIE–The International Society for Optical Engineering, vol. 1463, Mar. 1991.

*Primary Examiner*—S. Rosasco
*Attorney, Agent, or Firm*—Antonelli, Terry, Stout & Kraus

[57] ABSTRACT

Disclosed are phase-shifting masks wherein restriction of light transmission at edges of phase-shifting patterns (e.g., at an edge where a 180° phase-shifting pattern ends on a light transmission region) is avoided, and methods of making such masks. The region of the transparent pattern of the mask, under the edge of the phase-shifting pattern, is made wider than that of the transparent pattern in other regions; moreover, an additional phase-shifting layer is provided at the edge of the phase-shifting pattern, the additional phase-shifting layer having a phase-shift preferably of less than 90°, to avoid a 180° phase shift at the edge. Also disclosed is a phase-shifting mask having repaired defects, and a method for repairing defects in phase-shifting masks, using an additional phase-shifting layer.

25 Claims, 19 Drawing Sheets

EXPOSURE MASK AND METHOD OF MANUFACTURE THEREOF

This application is a divisional application of application Ser. No. 08/019,889, filed Feb. 19, 1993, now U.S. Pat. No. 5,391,441.

BACKGROUND OF THE INVENTION

The present invention relates to exposure masks used in fabricating microfine patterns for semiconductor devices, superconducting devices, magnetic devices, optoelectronic devices and various other devices. The invention also relates to methods of fabricating such exposure masks and methods of correcting them, and methods of using them in fabricating the above-referred-to devices.

A reduction projection exposure method has been a commonly used method for fabricating microfine patterns in such devices as LSI circuits. Among the proposed techniques that employ the reduction exposure projection method in drastically improving the resolution is a method using a phase-shifting mask, which introduces a phase shift between exposure lights that have passed through adjacent transparent areas on the mask.

This method, in a case where a pattern consists of slender transparent and opaque areas occurring alternately, provides a transparent material (referred to as a phase shifter) on every other transparent area to introduce a phase shift of about 180 degrees between the lights that have passed through the adjacent transparent areas on the mask. The phase-shifting mask can be manufactured by providing a phase shifter on a particular transparent area on a conventionally used chrome mask. This is discussed, for example, in *IEEE Trans. on Electron Devices*, ED29, No. 12 (1982), pp. 1828–1836.

However, it is difficult to apply the above-mentioned method to all patterns. For example, when the phase-shifting mask is applied to a pattern of U-shape lying on its side, the arrangement of the phase shifter pattern will be as shown in FIG. 12, in which a pattern area 8 with a phase shifter and a pattern area 9 without it are directly in contact with each other. Because lights passing through these areas cancel each other at the boundary portion of the areas, a desired pattern cannot be transferred.

With the above-mentioned technique, since the phase shift is changed stepwise, the resist pattern is constricted at a boundary area where the phase changes, due to a sharp change of light intensity, giving rise to lack of uniformity and a possibility of pattern break. Also, defects in the phase shifter will transfer the defects as irregular resist patterns or defects.

A limitation may arise as to patterns to which the method of providing a 180 degree phase shifter can be applied. As a means to alleviate such a limitation, there is a method which changes the phase shift stepwise from 0 degree to 180 degrees, as mentioned in the Japanese Laid-Open No. 34854/1990. This method utilizes the fact that the interference effect of the exposure light decreases as the phase shift decreases from 180 degrees, so that an opaque region likely would not be formed.

As a method of fabricating such a phase-shift mask, the Japanese Patent Laid-Open No. 34854/1990 cites a method which performs sputtering a number of times to change stepwise the phase shift of the phase shifter material such as a siliceous film, a method which etches the phase shifter film and mask substrate stepwise, and a method which repeats the processes of resist coating, resist pattern forming and hardening. The former two methods, however, since they must perform the sputtering and etching a number of times, make the mask forming process complex. With the third method, as shown in FIG. 8 of the Japanese Patent Laid-Open No. 34854/1990, an area for giving a 180 degree phase shift is formed by performing sputtering and coating a number of times. Not only does this render the mask manufacturing process complicated but accumulates film thickness variations due to sputtering and coating, so that it may become difficult to precisely control the phase shift at exactly 180 degrees.

With the above-mentioned techniques, the mask structure and the mask making process become complicated.

As a further proposed technique to alleviate the limitation of pattern variations to which the phase-shifting mask can be applied, there is a method which provides an area of, say, 90 degree phase shift in a boundary portion between the 0 degree phase shift area and the 180 degree phase shift area. The arrangement of the mask patterns according to this method is shown in FIG. 13. A first transparent pattern area 10 is a transparent area with no phase shifter, a third transparent area 12 is an area with a phase shifter which produces a phase shift of 180 degrees, and a second transparent area 11 is an area with a phase shifter which produces a phase shift of 90 degrees. Since the phase shift between the exposure lights that have passed through the adjacent transparent areas is 90 degrees, the light shielding effect due to interference of light at the boundary portion is weakened. Therefore, the desired U-shaped pattern can be transferred. This is described in Japanese Patent Laid-Open No. 34854/1990.

To form a phase shifter pattern with two phase shifts—180 and 90 degrees—as shown in FIG. 13, a conventional method uses an electron beam resist material as the phase shifter material and regulates the electron beam exposure dosage to control the phase shift, i.e., the thickness of the phase shifter film. Information on this subject was made public in the *35th International Symposium on Electron, Ion and Photon Beams*, (1991), L1.

In addition, in fabricating devices such as DRAMs using the above-mentioned phase-shifting mask, defects in the mask pattern significantly lowers productivity. Therefore, it is essential to develop a technique to manufacture masks without defects or a technique for correcting the defects perfectly.

In the case of a phase-shifting mask, any defects in the phase shifter will not only make it impossible to produce a normal phase shift effect but will transfer this part as a defect or an irregular pattern. Hence, a technique to correct the phase shifter defects is also needed.

A proposed method of correcting defects in the phase shifter pattern of the phase-shifting mask is to make the mask structure easy to correct so that the defects can be corrected by using a selective etching technique, using, for example, a focused ion beam. An illustrative structure may have a second phase shifter layer for defect repairing between the phase shifter and the mask substrate. This structure is introduced in the *51st Lecture Meeting of Applied Physics Society*, 2-volume collection of lecture texts, page 493, 2-p-ZG-10.

SUMMARY OF THE INVENTION

Accordingly, it is a first object of the present invention to provide a phase-shifting mask which avoids cancelling of light at boundary portions between adjacent light-transmission regions having different phase, or between adjacent light-transmission regions wherein one of the adjacent regions has a phase-shifting mask and the other has no phase-shifting mask.

It is a further object of the present invention to provide a method of fabricating a phase-shifting mask which avoids such cancelling of light at boundary portions, which method is simple and of relatively few processing steps.

It is a further object of the present invention to provide a method of repairing defects in phase-shifting masks (e.g., in a phase shifter, of such phase-shifting masks), and to provide a repaired phase-shifting mask.

It is a further object of the present invention to provide a method of forming patterns on a substrate, useful in the manufacture of semiconductor devices and other devices, including superconducting devices, magnetic devices, and optoelectronic devices, using a phase-shifting mask which avoids such cancelling of light at boundary portions.

The foregoing objects are achieved by the present invention, as described in the following. Various illustrative examples of the present invention are presented. As can be appreciated, these illustrative examples are representative of, and are not intended to limit, the present invention, which is defined by the appended claims.

The following disclosure is provided in connection with various drawing figures. In various of the drawing figures, structure denoted by the same reference characters have substantially the same function.

In a method of designing a mask pattern for the phase-shifting mask which has a specified transparent pattern used to project and expose a mask pattern on a substrate, and which has a phase shifter pattern used to give a phase shift to the transmitted light, the present objects are achieved by a mask pattern designing method, in which an area of a transparent pattern which includes the edge of the phase shifter pattern is set larger in width than the transparent pattern adjacent to the area, and in which one of the continuous edges of the phase shifter pattern is arranged in that area. The problem is also solved by a phase-shifting mask fabricated by the above-mentioned mask pattern designing method. The increase in width compensates for interference in the exposure light at the edge.

The present objects are also achieved by a method of fabricating a phase-shifting mask which is used to transfer the pattern mask onto a substrate and which has a specified transparent pattern and a transparent thin film pattern to give a phase shift to the transmitted light. That is, the mask fabricating method which achieves the objects includes: a process of forming a specified opaque pattern on a transparent substrate; a process of forming a specified transparent thin film pattern on the substrate to give a phase shift to the exposure light; a process of forming a film of negative tone radiation sensitive material on the substrate; a process of emitting exposure energy against a specified area of the film, for example, an area including a pattern edge portion of the transparent thin film pattern on, or an area close to, the pattern edge of the transparent thin film pattern; a process of developing the specified pattern by dissolving an unexposed area of the film; and a heat treatment process.

The foregoing objects are also achieved by a mask defect correction method in which the specified area mentioned above is an area including a defective part of the transparent thin film pattern or an area close to that defective part.

Further, the foregoing objects are also achieved by a mask fabrication method and a mask defect correction method, in which the thickness d of the film, formed, e.g., by exposure, development and heat treatment of negative tone radiation sensitive material, satisfies the following relationship so that the phase shift of the exposure light introduced by the film is less than 90 degrees:

$$d \leq \lambda/\{4(n-1)\},$$

where $\lambda$ is a wavelength of the exposure light used to expose the mask pattern onto the substrate and n is a refractive index of the negative tone radiation sensitive material at the wavelength $\lambda$.

The foregoing objects are also achieved by a mask defect correction method, whereby the thickness d of such film, formed from such negative tone radiation sensitive material, satisfies the following relationship so that the exposure light introduced by the film has a phase shift of about 360 degrees, i.e., it is almost in the same phase as the other exposure light:

$$(3/4) \cdot \{\lambda/(n-1)\} \leq d \leq (5/4) \cdot \{\lambda/(n-1)\},$$

where $\lambda$ is a wavelength of the exposure light used to expose the mask pattern onto the substrate and n is a refractive index of the film formed from the negative tone radiation sensitive material at the wavelength $\lambda$.

The above-mentioned objects are also achieved by including as a radiation sensitive material a compound which includes at least a residual silanol group, or by including as a radiation sensitive material a compound which includes at least an acid generator and a compound which includes a residual silanol group.

The following compounds are illustrative of compounds containing a residual silanol group, which can be included as the radiation sensitive material according to the present invention:

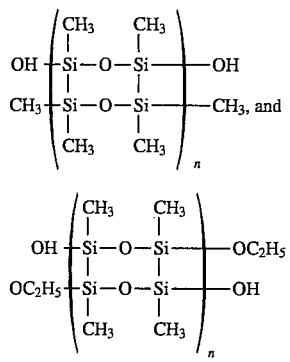

Triphenylsulfonium triflate ($Ph_3S^+OTF^-$) having the formula shown in the following:

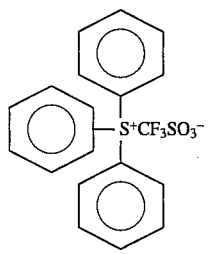

can be used as an acid generator.

The foregoing illustrative compounds having a residual silanol group and acid generator are representative compounds for use in the present invention and are not limiting.

The above-mentioned objects are also achieved through use of the presently described mask. Such mask can be used in forming patterns overlying, e.g., semiconductor substrates (for example, in transferring the pattern of the mask to a photoresist layer, in forming circuit patterns of the semiconductor device), in the manufacture of semiconductor devices; or, more generally, in manufacturing devices wherein patterns are formed in, e.g., a layer overlying a substrate (for example, in a photoresist layer overlying a substrate), transferred from the mask with good resolution.

As mentioned above, the phase-shifting mask improves resolution limit by setting the phase difference between the light rays that have passed through the adjacent transparent areas on the mask to almost 180 degrees. For this purpose, it is necessary to provide a phase shifter to introduce a phase shift to the specified transparent area on the mask.

Generally, the optimum value of the film thickness of the phase shifter, for introducing a 180 degree phase shift, is determined by an equation shown below:

$$d1 = \lambda / \{2(n-1-n0)\} \quad \text{(Equation 1)}$$

where $d1$ is a film thickness of the phase shifter, $\lambda$ is a wavelength of the exposure light, and $n1$ is a refractive index of the phase shifter film at the exposure light wavelength $\lambda$. $n0$ is a refractive index of air at the exposure light $\lambda$ and in practice may be considered to be $n0=1$. From Equation 1, the film thickness of the phase shifter to introduce a 90 degree phase shift is $d1/2$.

There are various methods to form a phase shifter pattern. One illustrative method may consist in forming a specified opaque pattern on the transparent substrate, then forming over this substrate a phase shifter film, for instance, a silicon oxide film, to the thickness of $d1$ as determined by Equation 1, and then processing this film into a specified pattern by using a resist.

When the phase shifters for introducing the phase shift of 180 degrees are placed on the transparent patterns, the edge of the phase shifter may happen to be located within the transparent area depending on the pattern. In that case, since the phase shift of the transmitted light changes 180 degrees at the edge of the phase shifter, the exposure lights interfere with each other at this portion, producing an opaque pattern. That is, an unwanted resist pattern may be formed.

As a method of avoiding unwanted resist patterns being formed by the phase shifter edge, a method is available which changes the phase shift stepwise to suppress the interference between the exposure lights. This method places a phase shifter that introduces a phase shift of 90 degrees between the area with 0-degree phase shift and the area with 180 degree phase shift.

When a resist pattern is transferred by using such a mask as mentioned above whose phase shift is changed stepwise, the resist pattern transferred becomes constricted at an area corresponding to the boundary portion where the phase shift changes. This local changing of pattern width may result in a break of the wiring pattern due to lack of exposure uniformity.

FIG. 30 shows an illustrative mask in which a phase shifter pattern 34 which introduces a phase shift of narrow transparent pattern 32. The exposure light that has passed through this mask pattern produces a light intensity distribution shown in FIG. 37 on the substrate onto which the pattern is transferred. FIG. 37 shows the theoretical calculation result of the light intensity distribution that is estimated to be produced when the narrow transparent pattern 32 whose width is $a=0.4$ μm is transferred under the condition that the exposure light wavelength is $\lambda=365$ nm, the numerical aperture (NA) of the projection optical system is NA=0.52 and the coherence is $\sigma=0.5$. In FIG. 37, the light intensity distribution is drawn by taking the light intensity on the substrate for a wide transparent area of the mask to be unity and connecting the points of equal intensity with a line for every light intensity difference of 0.2. The light intensity distribution is shown to be constricted at an area corresponding to the portion where the phase shift changes.

The size of the transferred resist pattern increases with the size of the transparent pattern. Hence, the size of the transparent pattern near the boundary area where the phase shift changes is partially increased as shown in FIG. 28. FIG. 29 shows the transparent pattern 32 of FIG. 28 with the phase shifter pattern 34 removed. The exposure light that has passed through this mask pattern produces a distribution of light intensity, as shown in FIG. 36, on the substrate onto which the pattern is transferred. The light intensity distribution is represented in the same way as in FIG. 37. The distribution in FIG. 36 employs the same optical conditions as was used in FIG. 37. The mask pattern in this case has the width $a=0.4$ μm, the width of partially expanded area $b=0.6$ μm, and the length of the partially expanded area $c=0.4$ μm. Comparison of FIG. 36 and FIG. 37 shows that partially expanding the transparent pattern as shown in FIG. 28 can limit the constriction of the light intensity distribution.

However, increasing the size of a part of the transparent pattern too much results in an excess widening of the light intensity distribution at this portion. Therefore, there is a unique optimum value to the size of the part of the transparent pattern to be expanded. This optimum size, however, changes according to the shape of the transparent pattern, the phase shift of the exposure light introduced by the transparent film, and the optical conditions of the exposing apparatus. It is preferred that the pattern size be set to an optimum value for each of these conditions.

Where the phase shift change is 180 degrees, the interference effect of the exposure lights is large, so that it is difficult to limit the constriction of the pattern even by partially expanding the transparent pattern. Hence, the phase shift is preferably less than 120 degrees.

Next, explanation is given concerning a case where a phase shift of 180 degrees is introduced by the phase shifter pattern 33, by referring to a schematic mask structure shown in FIG. 50. To suppress the interference between exposure lights, the phase shift is changed stepwise or progressively. That is, a second phase shifter pattern 4 that introduces a phase shift of 90 degrees is put close to the phase shifter pattern 33. Further, the portions of the transparent pattern 32 which are close to those two edges of the second phase shifter pattern 4 that are located in the transparent pattern 32 and where the phase shift changes—are partially enlarged. This limits variations in the pattern size near the edges of the second phase shifter pattern 4 where the phase shift changes.

To suppress the interference effect, the phase shift should be changed progressively rather than stepwise.

A spin coating-type glass becomes transparent like glass when heated to about 200° C. or higher, and has a high mechanical durability. The spin coating-type glass containing residual silanol groups, when exposed to exposure energy such as electron beams, develops into a negative pattern. By making use of these properties, it is possible to directly form the above-mentioned phase shifter pattern without using a resist material.

As a further aspect of the present invention, and as shown in FIG. 1, by using a known method, a first phase shifter 3 is formed so that the phase shift is 180 degrees, i.e., formed to a thickness that meets the condition of Equation 1. Then, a film, such as a coating-type glass, made of a spin-on-glass material containing a compound having a residual silanol group, is formed over the substrate. This material, when exposed to exposure energy such as electron beams, develops into a negative pattern. The film is formed to a thickness d that meets the requirement of $d \leq \lambda/\{4(n-1)\}$ where n is a refractive index of the spin-on-glass material at the exposure light wavelength $\lambda$, so that the phase shift of the exposure light introduced through the film is less than 90 degrees. By appropriately selecting the coating conditions, it is possible to smoothly change the thickness of the film near the pattern edge of the first phase shifter 3, as shown in FIG. 1.

Next, by radiating the exposure energy such as electron beams onto an area near and including the pattern edge of the first phase shifter 3 and developing the mask with a developing solution (e.g., methanol, acetone or an alkaline solution), the second phase shifter 4 can be formed.

While the above example employs a negative tone radiation sensitive material, a similar pattern can be produced if a positive tone radiation sensitive material is used. Illustrative (and not limiting) of positive tone radiation sensitive materials is PMMA (polymethylmethacrylate).

In the foregoing, it is described that the second phase shifter is formed by exposure and development. Such technique is desirably used where both the first and second phase shifters are made of the same material. Where the first and second phase shifters are made of different materials, having different etch rates in a specified etchant, the second phase shifter can be formed by selective etching, using, e.g., resist patterns. The first phase shifter can be formed by development, or etching (using, e.g., a resist pattern).

As indicated previously, as a negative-type radiation sensitive material there is a spin-on-glass compound having silanol groups. The composition applied can include the spin coating-type glass having a silanol-containing compound in a solvent (e.g., methanol or other alcohol). Upon irradiation of the applied composition by, e.g., ion or electron beam, and after heat treatment, a glassy material having Si-O-Si ••• is formed.

The second phase shifter 4 provides a phase shift, overlying, e.g., the transparent substrate 1, that is larger than zero degrees. The shift in phase, due to the second phase shifter, changes, e.g., increases, as the second phase shifter 4 extends from overlying the substrate to overlying the first phase shifter 4. This change (increase) in phase shift, from the substrate to the phase shifter, is gradual (e.g., substantially without any stepwise increase), avoiding problems in connection with a sudden increase in phase shift at an edge of a first phase shifter, as discussed previously. While there would be a small stepwise increase in phase where the second phase shifter 4 begins on layer 2, and the phase shift would increase to more than that of the first phase shifter 3 where the second phase shifter 4 extends on the first phase shifter 3, these stepwise changes would not be substantial (that is, they would be limited), and the objectives of the present invention can be achieved. Thus, a single phase shifter layer provides the gradual change, decreasing the number of manufacturing steps as compared with previously proposed processes having a plurality of layers introducing different phase shifts.

The workings will be explained in more detail by referring to FIGS. 2 and 3. When only a 180 degree phase shifter pattern is formed, the light intensity is small at the edge of the phase shifter pattern with the result that this portion is transferred as an opaque pattern, making the transfer of a desired mask pattern impossible.

With the phase shifter pattern formed in a way described above, the phase shift of a light immediately after it has passed through the mask of FIG. 1 changes as shown in FIG. 2. Here, let us consider a case where another 90 degree phase shift is introduced to the exposure light by the second phase shifter 4. On the 180 degree phase shifter pattern, the phase shift changes further by 90 degrees. On the other hand, where no phase shifter pattern is formed, the phase shift is 90 degrees. In the intermediate portion, the phase shift gradually changes from 270 degrees to 90 degrees.

Hence, the light which has passed through the mask portion of FIG. 1 changes its light intensity on the substrate onto which the pattern is transferred, as shown in FIG. 3. When the phase shift is 90 degrees, the interference effect is smaller than when the phase shift is 180 degrees, so that the attenuation of the light intensity can be better suppressed than when the phase shift is 180 degrees. The film of radiation sensitive material, on the area where the light intensity is stronger than a specified value, dissolves after being developed if the film of radiation sensitive material is of a positive type; and, if it is of a negative type, remains after being developed, to form a pattern. Hence, changing the phase gradually prevents the formation of an opaque area at a location corresponding to the pattern edge of the first phase shifter 3, whereby no pattern would thereby be formed on the substrate.

While the above description takes an example in which the second phase shifter 4 is formed to such a thickness that a further phase shift of 90 degrees is introduced, the thickness of the second phase shifter 4 is preferably not close to the film thickness that will introduce the phase shift of 180 degrees. In practice, the thickness of the second phase shifter 4 need only be such that the phase shift introduced will not allow the transfer of an opaque pattern. The phase shift is preferably less than 120 degrees, or more preferably less than 90 degrees. That is, it is desired that the film thickness d of the second phase shifter 4 satisfy the relationship $d \leq (2/3) \cdot \{\lambda/2(n-1)\}$, and more desirably $d \leq \lambda/\{4(n-1)\}$. This is because the light interference effect becomes stronger as the phase shift comes closer to 180 degrees.

FIG. 31 shows schematically the structure of a part of the mask which has the phase shift continuously change near the edges of the phase shifter pattern 33. FIG. 32 shows schematically a cross-section taken along the line A—A' in FIG. 31. FIG. 33 is a schematic figure showing the mask of FIG. 31 with the second phase shifter pattern 4' removed.

The mask shown in FIG. 31 can be fabricated by first forming the phase shifter pattern 33, coating the substrate with a radiation sensitive material such as negative type electron beam resist, subjecting it to a direct electron beam exposure and developing it to form a second phase shifter pattern 4'.

In this case, too, the change in phase shift of the exposure light becomes relatively large at the edge of the phase shifter pattern 33, so that in a mask shown in FIG. 34, for example, the resist pattern becomes constricted at a part corresponding to an area near the pattern edge of the phase shifter pattern 33. FIG. 35 is a schematic figure showing the mask of FIG. 34 with the second phase shifter pattern 4' removed. By expanding the portion of the transparent pattern near the edge of the phase shifter pattern 33 as shown in FIG. 31, the constriction of the resist pattern can be restrained.

In the above we showed examples where an isolated line pattern made up of slender transparent patterns is transferred. General patterns can be treated as being this case expanded.

An illustrative application of the above method to a comb-shaped transparent pattern 36 is shown in FIG. 43.

With 180 degree phase shifter pattern 33 arranged on alternate transparent "teeth" areas of the comb-shaped pattern 36, areas where the phase shift changes 180 degrees are formed in a body portion of the comb-shaped transparent pattern 36. Hence second phase shifter patterns 4 that introduce a phase shift of 90 degrees are placed between the area of 0 degree phase shift and the area of 180 degree phase shift. However, simply placing the second phase shifter pattern 4 in this way results in a constriction of the light intensity distribution near the boundary area where the phase changes. To avoid the constriction, the transparent pattern is partially enlarged near the boundary area where the phase changes. FIG. 44 shows the comb-shaped transparent pattern of FIG. 43 without the phase shifter pattern 33 and without the second phase shifter pattern 4. With the method described above, it is possible to transfer a desired comb-shaped pattern with a limited constriction of the resist pattern.

An illustrative mask structure having areas with phase shifts of 0, 60, 120 and 180 degrees is reported in the *51st Lecture Meeting of Applied Physics Society,* 2-volume collection of lecture texts, 27p-ZG-4 (page 491). In this structure, however, the overall size of the transparent pattern in the body portion of the comb-shaped pattern where the phase shift change occurs is made more than two times larger than the size of the alternate transparent areas of the comb-shaped pattern. This method reduces the pattern density and therefore is not desirable in terms of integrating devices with high density.

According to another object of the present invention, when manufacturing devices, such as a DRAM, by using the phase-shift mask, any mask pattern defects will lower the productivity because it is transferred as an irregular resist pattern. It is therefore necessary to develop a technique to easily correct phase shifter defects in the phase-shift mask. Among the phase shifter defects of the phase-shift mask are (A) loss of phase shifter, (B) unwanted phase shifter remaining, and (C) foreign substance on the phase shifter.

As to (C), the foreign substance can be removed well by cleaning the mask.

As to (B), the remaining phase shifter can be selectively removed by using a focused ion beam. However, since the ion beam uses mainly gallium ions, there is a possibility of the mask transmission factor decreasing at the ion beam irradiation area. If the remaining phase shifter is a size smaller than the resolution limit, there is no need to repair.

As a means to correct (A), the loss of phase shifter, there is available a method mentioned previously in connection with the background of the present invention. This method, however, requires the mask structure to be formed in advance in a way that allows for future correction of the phase shifter defects. This in turn complicates the mask manufacture process and hence increases the production cost.

In general, a film produced by a spin coating method tends to have a smooth surface compared with a step of the substrate over which the film is formed, or to have a surface with less roughness than that of the substrate. For example, by using an appropriate coating condition, fine recesses can be buried well to form a relatively flat and smooth film surface. In a relatively large recessed area, the thickness of the film at the step portion gradually changes forming a smooth surface.

In order to repair a defect of loss of phase shifter, according to the present invention, initially a film is formed by using, e.g., a negative type radiation sensitive material, especially a spin coating-type glass which, when heat-treated, produces a film with high durability. With an appropriate coating condition selected, it is possible to form a relatively flat and smooth film surface. Then, exposure energy such as electron beams and ion beams are radiated against an area containing phase shifter defects, and the mask is developed to form a pattern on the area containing the phase shifter defects, thereby correcting these defects.

A process of repairing a phase shifter defect 5, detected by a mask inspection, will now be explained, with reference to FIG. 5. FIG. 4 schematically shows the cross section of the mask with the second phase shifter 4' formed to a thickness that will introduce a phase shift of 360 degrees, i.e., to a thickness two times d1 given in Equation 1. When the phase shifter defect 5 is smaller than the thickness of the film, selection of appropriate coating conditions enables the phase shifter defect 5 to be buried to form a relatively flat film surface. With the above defect repaired, the phase shift between the exposure light that has passed through the first phase shifter 3 and the exposure light that has passed through the repaired area is 360 degrees, i.e., the two exposure lights are of the same phase, so that the same effect is obtained as when there is no phase shifter defect.

FIG. 6 shows schematically the cross section of the mask when the second phase shifter 4 is formed to a thickness that will introduce the phase shift of less than 90 degrees, for example, 30 degrees, from light transmitted through first phase shifter 3. The thickness of the film is one sixth of d1 given in Equation 1. If a material made up mainly of silicon oxide, such as a spin coating-type glass, is used for the phase shifter, the refractive index is about 1.45 and hence the film thickness is about 70 nm. On the other hand, when a 0.2–μm pattern is to be transferred by using a reduction projection exposure equipment with the reducing ratio of 5:1, the mask pattern dimension is 1.0 μm. Therefore, the film thickness is sufficiently smaller than the pattern so that the phase shifter defect is generally considered to be larger than the film thickness. In such a case, the phase shifter defect 5 is not flattened well, leaving the recess likely to be formed. However, since the phase shifter 5 defect is buried, the phase shift is smaller than 180 degrees, so that the phase shifter defect 5 is effectively not transferred. In other words, the phase shifter defect 5 is repaired.

FIG. 7 shows a schematic cross section of a mask with two kinds of phase shifter defects 5 and 5'. In this case, to repair the phase shifter defect 5 requires providing in this defective area a second phase shifter 4'. The second phase shifter 4' has a phase shift such that a total phase shift at phase shifter defect 5 (through first phase shifter 3 and second phase shifter 4') is about 360 degrees (generally, the objectives according to the present invention are attained where the second phase shifter 4' has a phase shift such that the total phase shift is 270°–450°) from, or is almost in the same phase with, the exposure light that has passed through the first phase shifter 3 where there is no defect; or providing a second phase shifter 4 (see FIG. 9) such that a total phase shift at phase shifter defect 5' is less than 90 degrees from the phase shift through phase shifter 3 where there is no defect.

Where there is a phase shifter defect 5 as seen, for example, in FIG. 7, in practice the second phase shifter 4' should have a phase shift of less than 90°, or between 270° and 450°.

To introduce a phase shift of about 360 degrees, the thickness d of the second phase shifter 4' should meet the following relationship:

$$(3/4)\cdot\{\lambda/(n-1)\} \leq d \leq (5/4)\cdot\{\lambda/(n-1)\}$$

where λ is a wavelength of exposure light used to expose the mask pattern onto the substrate, and n is a refractive index of the phase shifter 4' at the wavelength λ.

To introduce a phase shift of less than 90 degrees, the second phase shifter 4' must be formed to a thickness d that meets the following requirement:

$$d \leq \lambda/\{4(n-1)\}$$

In repairing the phase shifter defect 5', a second phase shifter 4" needs to be formed, to a thickness d that meets the following requirement:

$$(1/4)\cdot\{\lambda/(n-1)\} \leq d \leq (3/4)\cdot\{\lambda/(n-1)\}$$

Generally, to repair phase shifter defect 5' the second phase shifter 4" should shift the phase of the exposure light 90°–270°.

As is seen from the above, since the thickness of the second phase shifter used to repair shifter defects varies from one defect to another, it is necessary to correct the phase shifter defects 5 and 5' separately. Because the second shifter 4' is two times thicker than the second phase shifter 4", the second phase shifter 4' may be formed by forming a one-half-thick layer twice so that the total phase shift will be 360 degrees. This method performs two coating operations so that the film surface becomes smoother.

Using the above-mentioned method makes it possible to repair phase shifter defects easily without having to employ a special mask structure.

With this method it is also possible to repair unwanted remains of film of material for forming the phase shifter. That is, as shown in FIGS. 10 and 11, it is only necessary to form a second phase shifter 4' at an area including the unwanted remains of phase shifter 6, so that the phase shift introduced will be 360 degrees (that is, the total phase shift introduced by second phase shifter 4' and unwanted remains of phase shifter 6, at a location where the second phase shifter 4' is provided on the unwanted remains, is 360 degrees). This corrects the unwanted remains of phase shifter 6. When the thickness of the unwanted remains of phase shifter 6 is such that the corresponding phase shift is less than 90 degrees, or when it is smaller than the resolution limit, this defect is essentially not transferred and accordingly this defect needs no repair.

As mentioned in the foregoing, this invention permits repair of phase shifter defects to be performed efficiently and accurately, by a relatively simple manufacturing technique.

DETAILED DESCRIPTION OF THE INVENTION

In the following, the present invention will be described in terms of specific embodiments thereof. These specific embodiments are illustrative of, and not limiting of, the present invention, whose intended scope is defined by the appended claims.

While the present invention is described herein in terms of apparatus, and materials, comprised of specific components, it is intended that the apparatus, and materials, can consist essentially of, or consist of, the specific components.

Embodiment 1

Now, one embodiment of the invention will be described.

A phase-shifting mask was manufactured which is used in the process of making a wiring pattern of an LSI circuit of a 64-megabit DRAM (dynamic random access memory) class with a minimum design size of 0.3 μm. The process of fabricating a phase-shifting mask for an i-line (exposure light wavelength of 365 nm) reduction projection exposure equipment, with a numerical aperture of NA=0.50 and reduction factor of 5:1, will be explained by referring to FIGS. 18 to 22.

A synthetic quartz substrate 21 is laminated with a transparent conductive film 22 and then a chrome film 23. The transparent conductive film 22 is provided to prevent charge-up during the electron beam exposure. The chrome film 23 is used as a light-shielding film.

While this example uses a chrome film as the light-shielding film, it is possible to use other films opaque to the exposure light, for example, a molybdenum silicide film. In order to allow phase shifter defects to be readily repaired, a second phase shifter layer may be provided between the transparent conductive film 22 and the chrome film 23. The second phase shifter layer may be formed on the chrome film.

Figure 18:
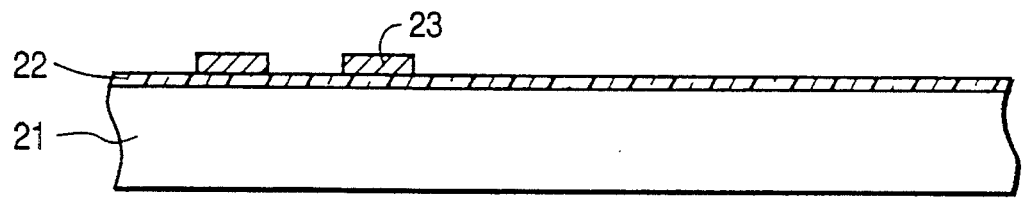
FIG. 18 is a schematic diagram showing a part of the process for fabricating a further embodiment of the phase-shifting mask according to this invention.

A positive type resist RE2000P (made by Hitachi Kasei) was coated on the substrate to a thickness of 0.5 μm. This was subjected to 30 minutes of heat treatment at 100° C., after which a specified light transmission pattern is drawn on the resist by using a direct electron beam exposure system with an acceleration voltage of 30 kV. The device is then developed and heat-treated to form a desired resist pattern. Next, with this resist pattern used as a mask, the chrome film was etched by a wet process using specified etching solution and etching conditions known in the art. And then the resist pattern was removed to form a desired opaque pattern as shown in FIG. 18.

Next, the substrate was spin-coated with a coating-type glass OCD Type 7 (made by Tokyo Ohka). This coating-type glass film is used as a phase shifter layer. The phase shifter layer may be made of other materials than cited above, such as other types of coating glasses and organic polymer materials. These materials preferably have a transmission factor of more than 90% for the exposure light.

Generally, the optimum thickness of the phase shifter layer is determined by Equation 1, where d is a phase shifter layer thickness, λ is a wavelength of exposure light and n is a refractive index of the phase shifter layer at the exposure light wavelength λ. In this embodiment, λ=365 nm and n=1.45. According to Equation 1, the thickness of the coating-type glass layer is 406 nm. It was found that the coating-type glass layer, after being subjected to a process described in the following, is reduced to 90% in thickness of the original. Hence, in this embodiment the film thickness of the coating-type glass layer was set to 451 nm.

After this, the substrate was heat-treated at 200° C. for 30 minutes in a convection-type oven. The temperature and process time of the heat-treatment are not limited to the above-mentioned values.

Figure 19:
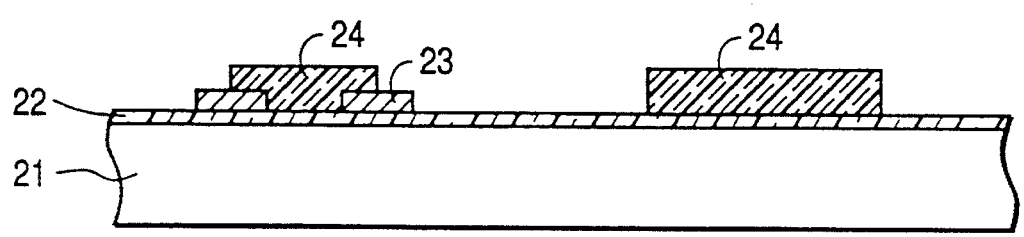
FIG. 19 is a schematic diagram showing a part of the process for fabricating a further embodiment of the phase-shifting mask according to this invention.

Next, the masked substrate was coated with a negative-type resist RD2000N (made by Hitachi Kasei) to a thickness of 0.5 μm. After being heat-treated at 80° C. for 30 minutes, the specified phase shifter pattern was exposed by using a direct electron beam exposure system with acceleration voltage of 30 kV. Next, with the resist pattern used as a mask, the coating-type glass layer was etched by a wet process using an appropriate etching solution and etching condition as known in the art. Then the resist pattern was removed to form a desired phase shifter pattern 24 as shown in FIG. 19.

Figure 20:
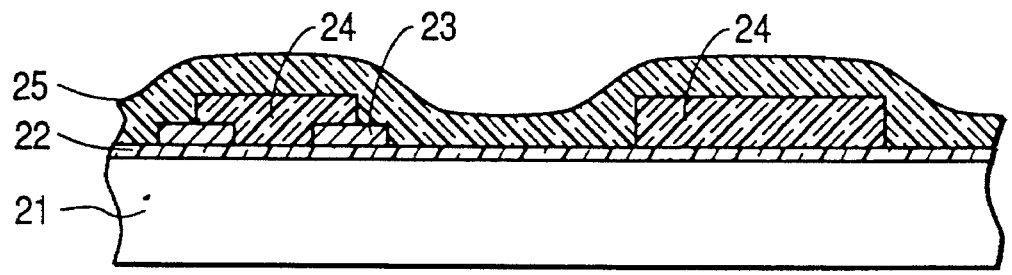
FIG. 20 is a schematic diagram showing a part of the process for fabricating a further embodiment of the phase-shifting mask according to this invention.

As shown in FIG. 20, a second coating-type glass layer 25 is formed on the above substrate. In this embodiment, the second coating-type glass layer 25 is formed to introduce a phase shift of 30 degrees. The thickness of the coating type glass layer 25 was set to $^{45}\!/\!_{6}$=75 nm. Although the thickness of the second coating-type glass layer 25 is not limited to the above-mentioned value, it is preferably not close to a thickness that introduces the phase shift of 180 degrees but preferably around the thickness that introduces the phase shift of less than 90 degrees. Then the substrate was heat-treated at 80° C. for five minutes in a convection-type oven. While the heat treatment temperature and time may be other than the values mentioned above, it is needless to say that they should not be such as will prevent the coating layers from being dissolved by a specified developing solution.

Figure 21:
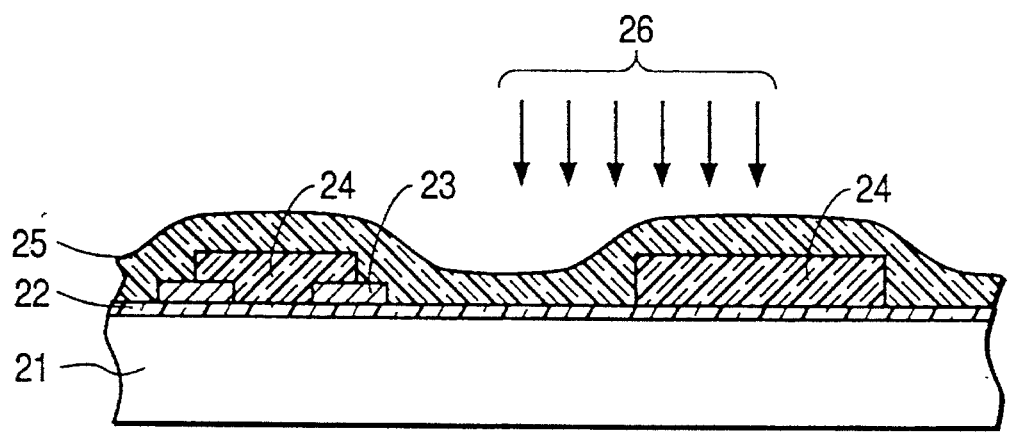
FIG. 21 is a schematic diagram showing a part of the process for fabricating a further embodiment of the phase-shifting mask according to this invention.

Next, electron beams 26 were radiated against a specified area containing the pattern edge of the phase shifter pattern 24 by using a direct electron beam exposure system with acceleration voltage of 30 kV, to expose a desired pattern (FIG. 21). While this embodiment uses electron beams 26 as exposure energy, other beams such as laser beams may be used, e.g., where materials which can be developed using laser beams is utilized.

Figure 22:
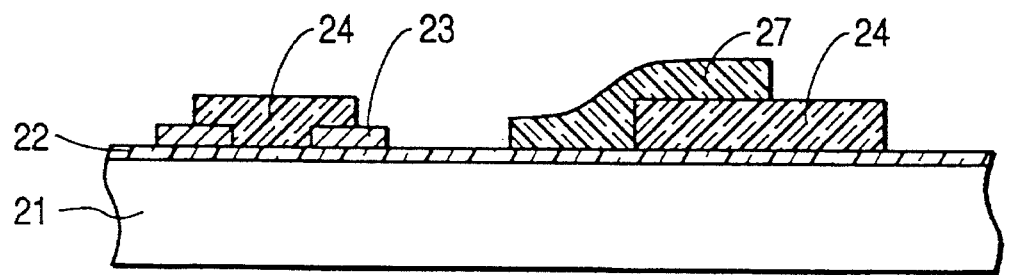
FIG. 22 is a schematic diagram showing a part of a cross-section of a further embodiment of the phase-shifting mask according to this invention.

After this, the device is developed by methanol for 30 seconds and dried, after which it is heat-treated at 200° C. for 30 minutes to form a second phase shifter pattern 27 as shown in FIG. 22. The heat-treatment temperature, though not limited to the one mentioned above, is preferably higher than a glass transition temperature or 200° C. to improve mechanical durability. In this way, a phase-shift mask of a desired pattern is fabricated.

Figure 23:
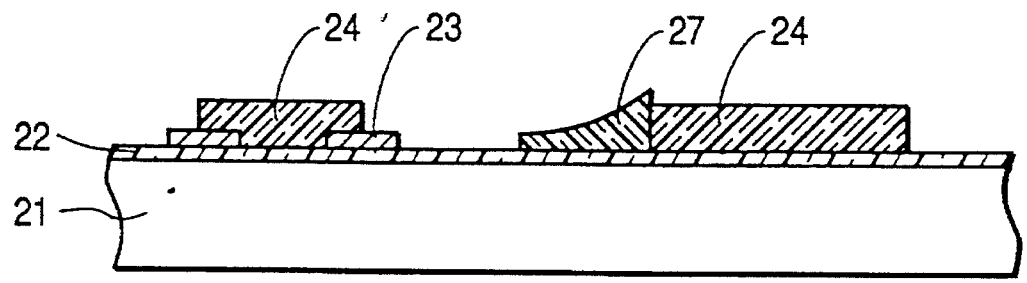
FIG. 23 is a schematic diagram showing a part of a cross-section of a further embodiment of the phase-shifting mask according to this invention.

While this embodiment radiates electron beams as the exposure energy against the area including the pattern edge of the phase shifter, it is possible to radiate the exposure energy against an area adjacent to the pattern edge and develop the layer to form a second phase shifter pattern 27 adjacent to the phase shifter pattern 24, as shown in FIG. 23.

The phase-shifting mask fabricated as described above and the reduction projection exposure equipment were used to transfer a desired pattern with good resolution.

Further, by using the phase-shifting mask made in this embodiment, it is possible to transfer a fine pattern which cannot be resolved by a conventional transmission-type mask. This in turn permits production of LSI circuits of 64-megabit DRAM class with high productivity.

Embodiment 2

A phase-shifting mask was manufactured which is used in the process of making a wiring pattern of an LSI circuit of 256-megabit DRAM class with a minimum design size of 0.25 μm. The process of fabricating a phase-shifting mask for a KrF excimer laser (exposure light wavelength of 248 nm) reduction projection exposure equipment, with the numerical aperture of NA=0.45 and reduction factor of 5:1, will be explained.

A synthetic quartz substrate is laminated with a transparent conductive film and then deposited with a silicon oxide film as the phase shifter layer for correcting defects. Substituting λ=248 nm and n=1.5 in Equation 1 gives the phase shifter layer a thickness of 248 nm. Thus, the silicon oxide film was formed to a thickness of 248 nm. The phase shifter layer may be formed of other materials than that mentioned above, but it is preferred that the material used have a transmission factor of more than 90% for the exposure light.

Then, the substrate Was vapor-deposited with a chrome film as the light shielding film, to a thickness of 80 nm. Next, the substrate was coated with a positive-type resist RE2000P (made by Hitachi Kasei) to a thickness of 0.5 μm. After being heat-treated at 100° C. for 30 minutes, a specified light transmission pattern was exposed by using a direct electron beam exposure system with acceleration voltage of 30 kV. Then, the device was subjected to a specified development and heat treatment to form a desired resist pattern. With the resist pattern used as a mask, the chrome layer was etched by a wet process using an appropriate etching solution and etching conditions. Then the resist pattern was removed to form a desired opaque pattern.

Next, the substrate was spin-coated with a coating-type glass OCD Type 7 (made by Tokyo Ohka). This coating-type glass film is used as a phase shifter layer. Substituting λ=248 nm and n=1.49 in Equation 1 gives the phase shifter layer thickness of 253 nm. It was found that the coating-type glass layer, after being subjected to a process described in the following, is reduced to 90% of the original thickness. Hence, in this embodiment the thickness of the coating-type glass layer was set to 281 nm. The phase shifter layer may be made of other materials than cited above, but these materials preferably have a transmission factor of more than 90% for the exposure light.

Then, the substrate was heat-treated at 80° C. for 10 minutes in a convection-type oven. The temperature and time of the heat treatment are not limited to those cited above.

Next, by using a direct electron beam exposure system with acceleration voltage of 30 kV, a specified phase shifter pattern was exposed, developed and heat-treated to form the phase shifter pattern on the substrate.

Next, the substrate was again spin-coated with the coating-type glass OCD Type 7 (made by Tokyo Ohka) to form a coating-type glass layer as the second phase shifter layer. In this embodiment, the second phase shifter layer thickness was set at 24 nm to introduce a phase shift of 30 degrees. The phase shift introduced may be other than 30 degrees. When the phase shift introduced by the second phase shifter is close to 180 degrees, there is a possibility of light interference forming an opaque pattern. For this reason, the phase shift introduced by the second phase shifter is preferably less than 120 degrees.

The second phase shift layer may be made of other materials than that mentioned above, but the materials used must be sensitive to the exposure energy and have the transmission factor of more than 90% for the exposure light.

Then, the substrate was subjected to five minutes of heat treatment at 80° C. in a convection-type oven. The temperature and time of the heat treatment are not limited to the above-mentioned values.

Next, a specified phase shifter pattern area was exposed by a direct electron beam exposure system with acceleration voltage of 30 kV. The substrate was developed by methanol for 30 seconds and dried, and then heat-treated at 200° C. for 30 seconds to form a second phase shifter pattern. Although the heat treatment conditions are not limited to those mentioned above, the heat treatment temperature is preferably higher than 200° C. to improve mechanical durability. In this way, a phase-shifting mask with a desired pattern was obtained.

The phase-shifting mask fabricated as described above and the reduction projection exposure equipment were used to transfer a desired pattern with good resolution.

Embodiment 3

A phase-shifting mask was manufactured which is used in the process of making a wiring pattern of an LSI circuit of a 64-megabit DRAM (dynamic random access memory) class with a minimum design size of 0.3 μm. A part of a mask pattern of a phase-shifting mask for an i-line (exposure light wavelength of 365 nm) reduction projection exposure equipment with the numerical aperture of NA=0.52 and reduction factor of 5:1 is shown in FIG. 14 and FIG. 15.

Figure 1:
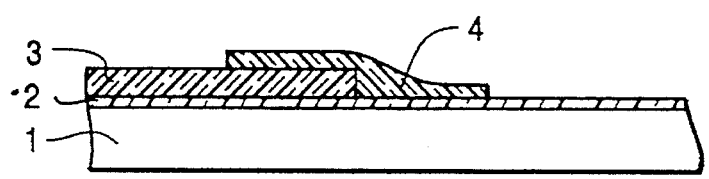
FIG. 1 is a schematic cross section of one embodiment of this invention.
Figure 2:
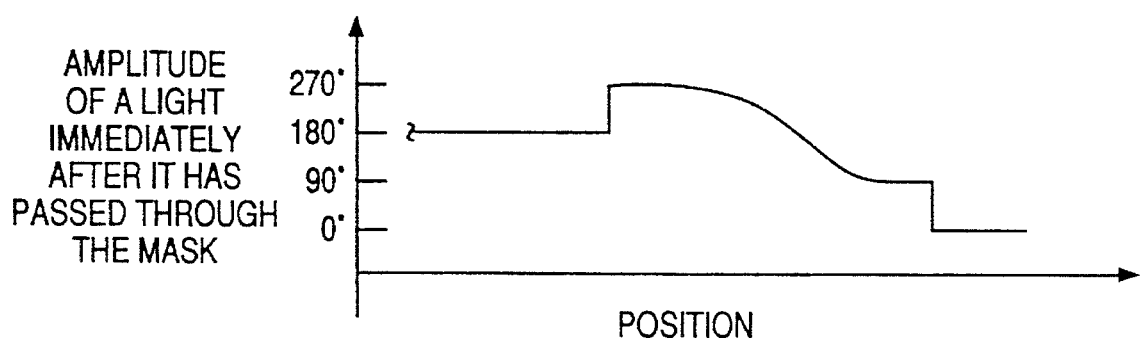
FIG. 2 is a schematic diagram showing the action of a mask according to this invention.
Figure 3:
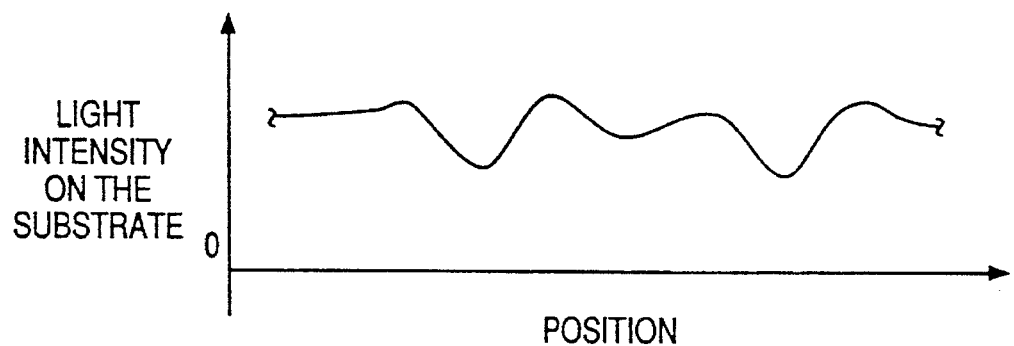
FIG. 3 is a schematic diagram showing the action of a mask according to this invention.
Figure 4:
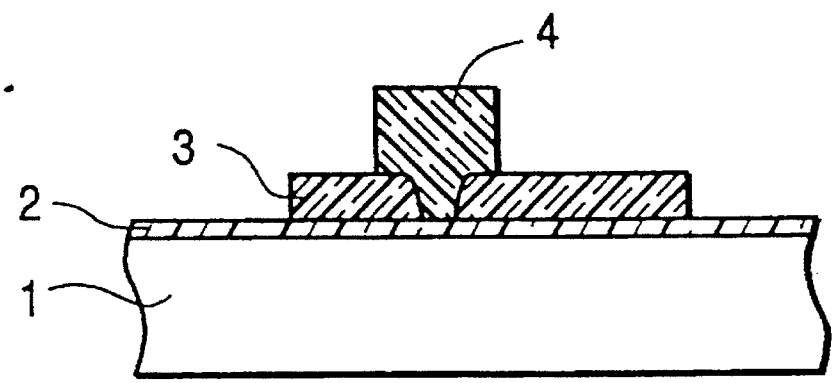
FIG. 4 is a schematic cross-section of another embodiment of the invention.
Figure 5:
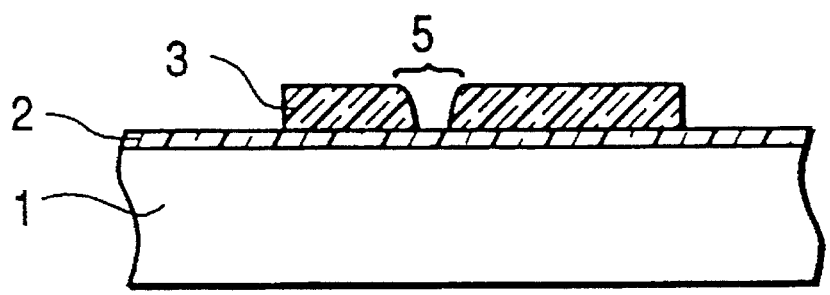
FIG. 5 is a schematic cross-section of an example of a phase-shift mask having a phase shifter defect.
Figure 6:
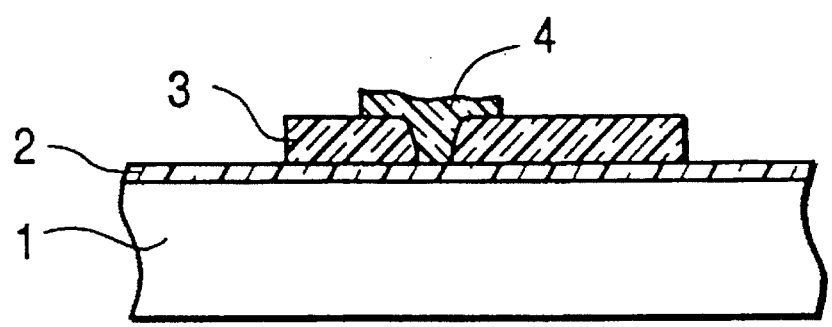
FIG. 6 is a schematic cross-section of a further embodiment of the invention.
Figure 7:
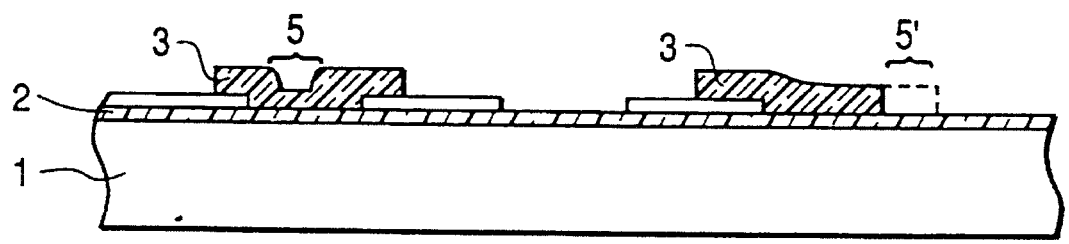
FIG. 7 is a schematic cross-section of an example of a phase-shift mask having phase shifter defects.
Figure 8:
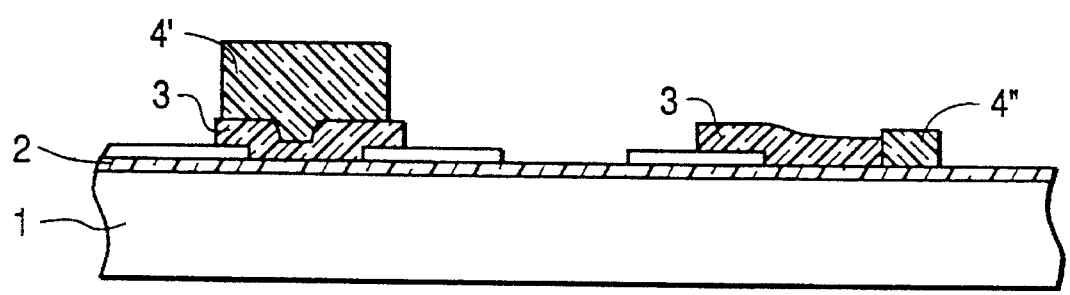
FIG. 8 is a schematic cross-section of a further embodiment of the invention.
Figure 9:
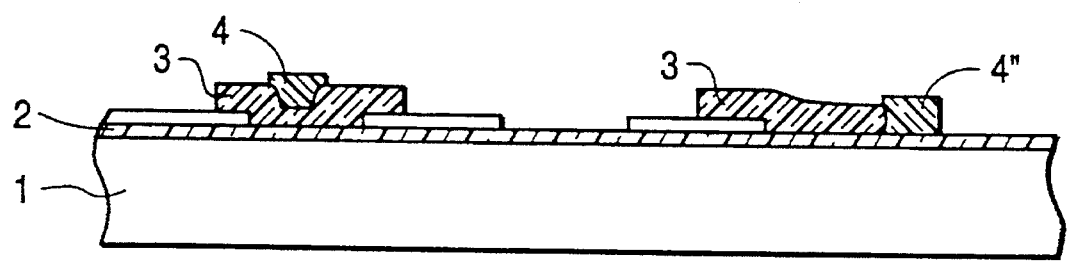
FIG. 9 is a schematic cross-section of a still further embodiment of the invention.
Figure 10:
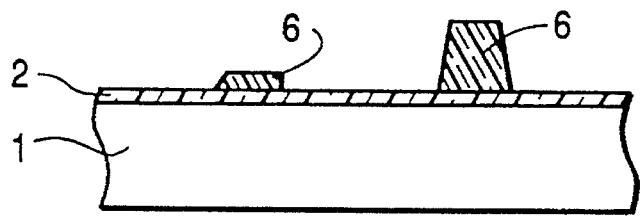
FIG. 10 is a schematic cross-section of an example of a phase-shifting mask having phase shifter defects.
Figure 11:
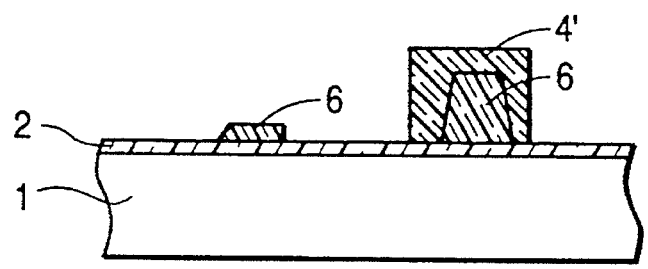
FIG. 11 is a schematic cross-section of a still further embodiment of the invention.
Figure 12:
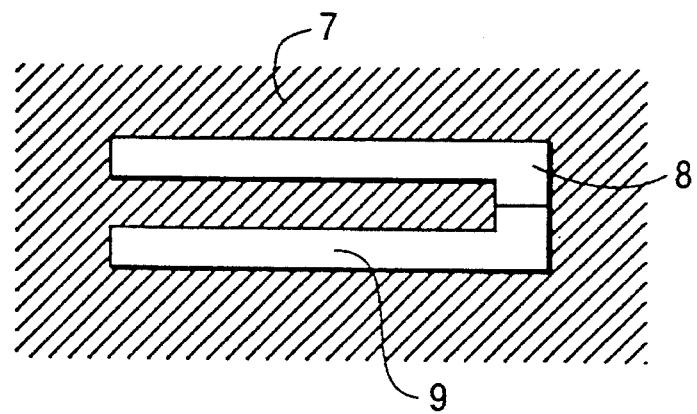
FIG. 12 is a schematic diagram showing an example of an illustrative phase-shifting mask.
Figure 13:
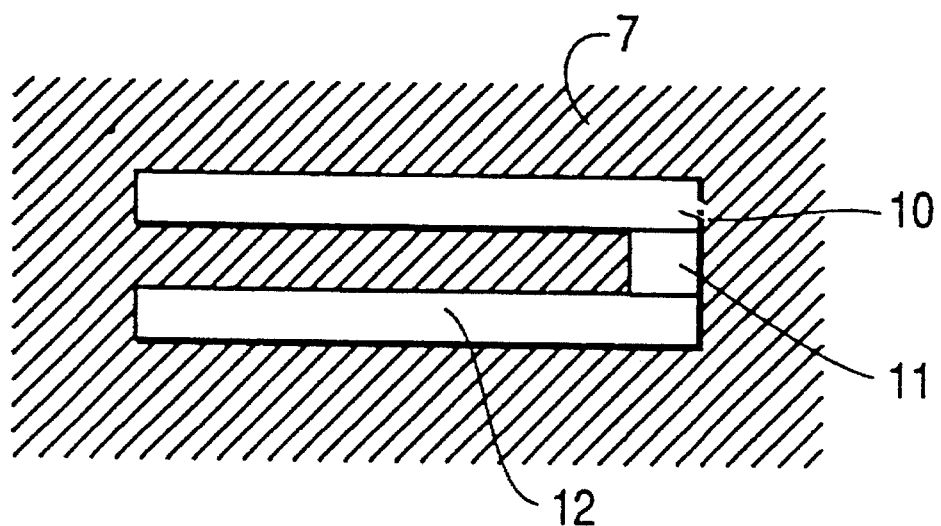
FIG. 13 is a schematic diagram showing an example of an illustrative phase-shifting mask.
Figure 14:
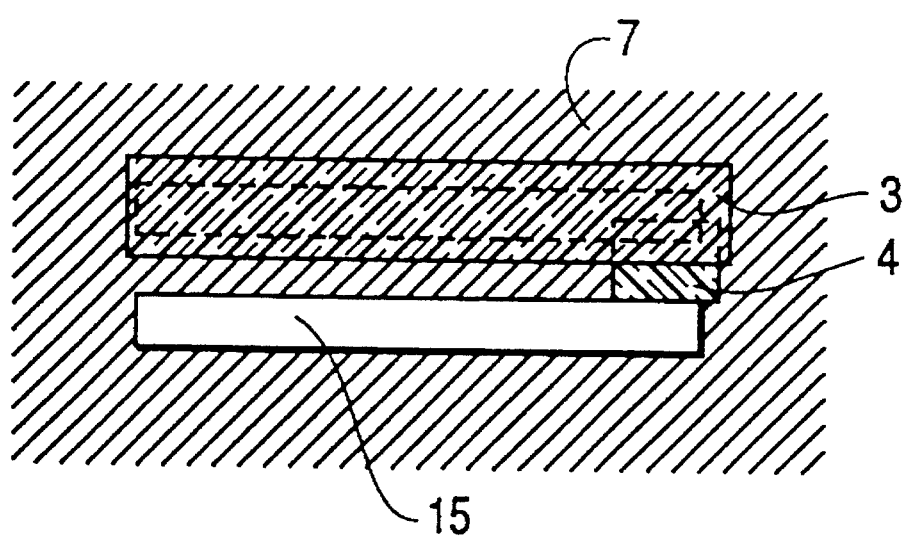
FIG. 14 is a diagram showing a still further embodiment of a phase-shifting mask according to this invention.

FIG. 14 shows a mask pattern to transfer a U-shaped transmission pattern. The light-shielding film 7 is selectively removed to form a U-shaped transmission pattern 15. Then, a second phase shifter 4 is formed on the transmission pattern 15 to such a thickness as will introduce a phase shift of 60 degrees. Further, a first phase shifter 3 is formed to a thickness that will introduce a phase shift of 180 degrees.

Figure 15:
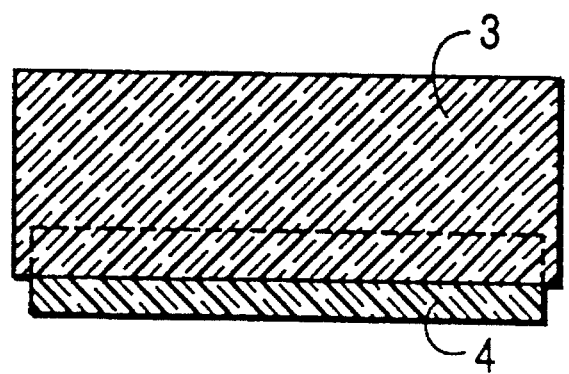
FIG. 15 is a schematic diagram showing a still further embodiment of a phase-shifting mask according to this invention.

FIG. 15 shows a mask pattern to transfer a U-shaped opaque pattern. A second phase shifter 4 is formed in the transparent area, followed by a first phase shifter 3 being formed.

In the following, the process of making a mask is described in more detail.

A synthetic quartz substrate was coated first with a transparent conductive film and then a chrome layer. The transparent conductive layer is provided to prevent charge-up during the electron beam exposure. The chrome film is used as a light-shielding film.

The substrate was coated with a positive-type resist RE2000P (made by Hitachi Kasei) to a thickness of 0.5 μm. After being heat-treated at 100° C. for 30 minutes, a specified light transmission pattern was exposed by using a direct electron beam exposure system with acceleration voltage of 30 kV. Then, the device was subjected to a specified development and heat treatment to form a desired resist pattern. With the resist pattern used as a mask, the chrome layer was etched by a wet process using an appropriate etching solution and etching conditions. Then the resist pattern was removed to form a desired opaque pattern.

Next, the substrate was spin-coated with a coating-type glass OCD Type 7 (made by Tokyo Ohka). Generally, the optimum thickness of the phase shifter layer is determined by Equation 1. In this embodiment, substituting λ=365 nm and n=1.45 in Equation 1 gives a coating-type glass layer thickness of 406 nm. It was found that the coating-type glass layer, after being subjected to a process described in the following, is reduced to 90% of the original thickness. Hence, in this embodiment the thickness of the coating-type glass layer as the phase shifter is 451 nm. To introduce the phase shift of 60 degrees, the film thickness was set to 150 nm. While the thickness of the coating-type glass layer may be other than the one mentioned above, it is preferably not close to a thickness that introduces a phase shift of 180 degrees, but preferably such a thickness as will introduce a phase shift of less than 90 degrees.

Then, the substrate was heat-treated at 200° C. for 30 minutes in a convection-type oven. The heat treatment conditions such s temperature and time are not limited to those described above.

Next, the masked substrate was coated with a negative-type resist RD2000N (made by Hitachi Kasei) to a thickness of 0.5 μm. After being heat-treated at 80° C. for 30 minutes, the specified pattern was exposed by using a direct electron beam exposure system with acceleration voltage of 30 kV. The substrate was subjected to a specified development and heat treatment to form a desired resist pattern. Next, with the resist pattern used as a mask, the coating-type glass layer was etched by a wet process using an appropriate etching solution and etching conditions. Then the resist pattern was removed to form a desired second phase shifter pattern 4.

Then, a second coating-type glass layer was formed over the substrate. In this embodiment, the second coating-type glass layer introduces a phase shift of 180 degrees. For this purpose, the second coating type glass layer thickness was set to 451 nm.

After this, the substrate was heat-treated at 80° C. for five minutes in a convection-type oven. While the temperature and time of the heat treatment are not limited to those mentioned above, it is noted that they should not be such as will prevent the coating layers from being dissolved by a specified developing solution.

Next, a specified phase shifter pattern was exposed by a direct electron beam exposure system with acceleration voltage of 30 kV. The substrate was developed by methanol for 30 seconds and dried, and then heat-treated at 200° C. for 30 seconds to form a first phase shifter pattern 3. Although the heat treatment conditions are not limited to those mentioned above, the heat treatment temperature is preferably higher than a glass transition temperature or 200° C. to improve mechanical durability. In this way, a phase-shifting mask with a desired pattern was obtained.

The phase-shifting mask fabricated as described above and the reduction projection exposure equipment were used to transfer a desired pattern with good resolution.

Embodiment 4

As mentioned in the first embodiment, a phase-shifting mask was manufactured which is used in the process of making a wiring pattern of an LSI circuit of 64-megabit DRAM (dynamic random access memory) class with a minimum design size of 0.3 μm. A part of a mask pattern of a phase-shifting mask according to this embodiment is shown in FIGS. 16 and 17.

Figure 16:
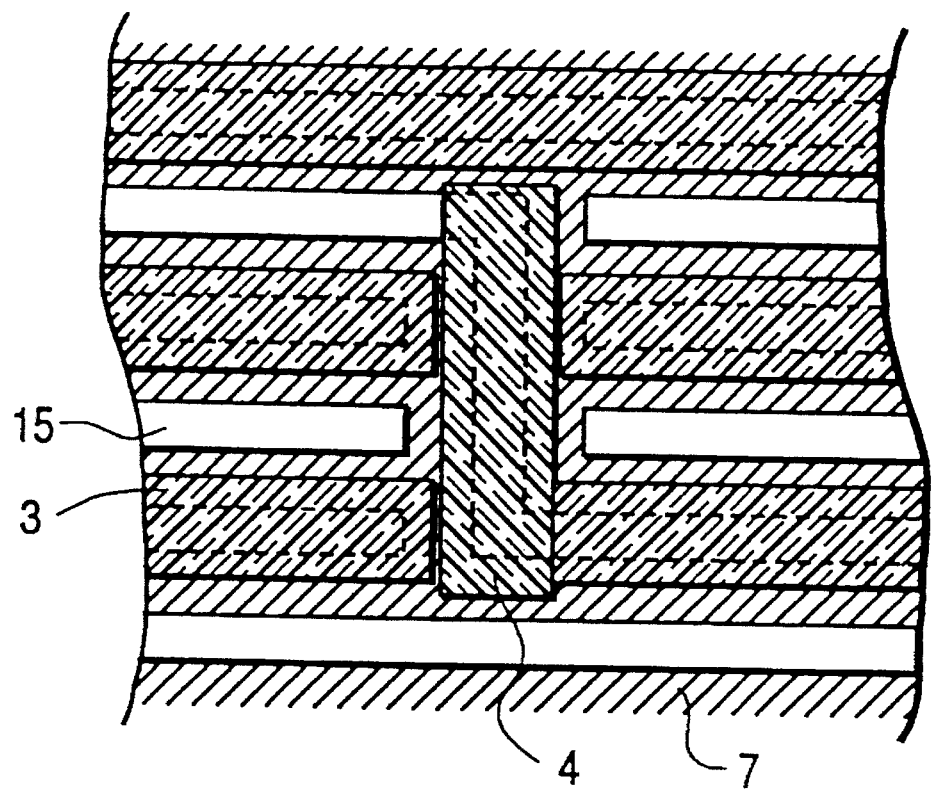
FIG. 16 is a schematic diagram showing a still further embodiment of a phase-shifting mask according to this invention.
Figure 17:
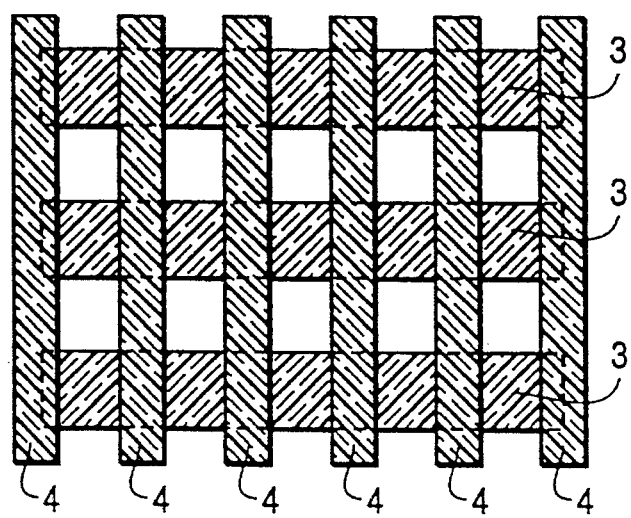
FIG. 17 is a schematic diagram showing a still further embodiment of a phase-shifting mask according to this invention.

FIG. 16 shows an arrangement of a second phase shifter 4 to transfer a key-shaped transmission pattern. FIG. 17 shows an arrangement of phase shifters which, in order to transfer an opaque fringe pattern, makes use of the fact that the light intensity decreases enough at the pattern edge of the first phase shifter 3 but does not decrease enough at the pattern edge of the second phase shifter 4.

The phase-shifting mask fabricated as described above and the reduction projection exposure equipment were used to transfer a desired pattern with good resolution.

Embodiment 5

A phase-shifting mask was manufactured which is used in the process of making a wiring pattern of an LSI circuit of 64-megabit DRAM (dynamic random access memory) class with a minimum design size of 0.3 μm. A process of repairing phase shifter defects on a phase-shifting mask, which is used by an i-line (exposure light wavelength of 365 nm) reduction projection exposure equipment with the numerical aperture of NA=0.52 and reduction factor of 5:1, will be explained with reference to FIGS. 24–27.

This embodiment takes, for example, a mask structure consisting of a synthetic quartz substrate 21 coated first with a transparent conductive film 22 and then with a chrome layer 23 and a phase shifter pattern 24. The transparent conductive layer 22 is provided to prevent charge-up during the direct electron beam exposure.

Figure 24:
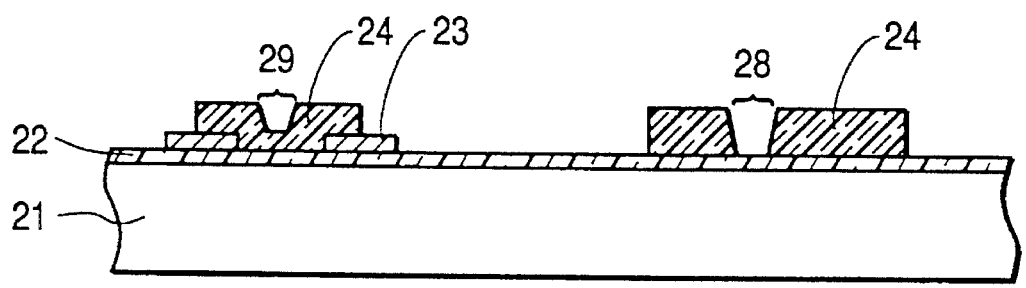
FIG. 24 is a schematic diagram showing an illustrative cross-section of a phase-shifting mask having phase shifter defects.

A phase-shifting mask formed by using a known technique and used by the above-mentioned exposure equipment was inspected by a mask pattern defect inspection apparatus. Phase shifter defects 28 and 29 were found. FIG. 24 shows a cross-section of the mask, which is estimated from observation of the mask pattern surface.

Figure 25:
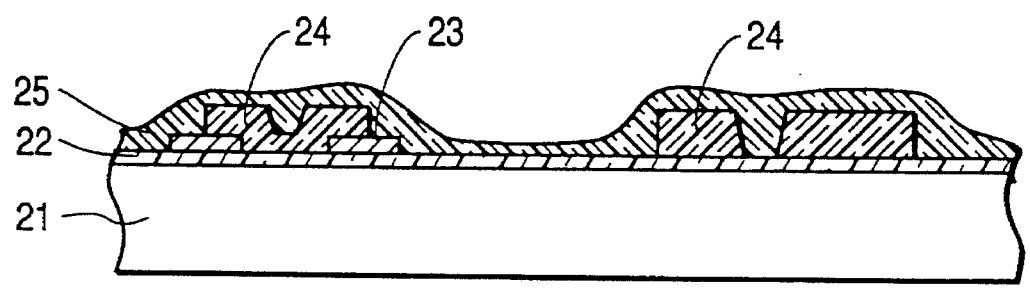
FIG. 25 is a schematic diagram showing a part of the process for fabricating a further embodiment of the phase-shifting mask according to this invention.

Next, the process of correcting phase shifter defects will be explained. First, the substrate was spin-coated with the coating-type glass OCD Type 7 (made by Hitachi Kasei) to form a film 25 as shown in FIG. 25. In this embodiment the coating-type glass is used as a negative-type radiation sensitive material, but other negative-type sensitive materials may be used. It is noted, however, that the materials used should preferably have a transmission factor of more than 90% for the exposure light.

Generally, the optimum thickness of the phase shifter layer is determined by Equation 1. In the equation, d represents a phase shifter layer thickness, λ an exposure light wavelength, and n ia refractive index of the phase shifter layer at the wavelength λ. In this embodiment, the refractive index n of the coating-type glass was 1.45 for the wavelength of λ=365 nm. According to Equation 1, the thickness of the coating-type glass layer is determined to be 406 nm. Thus, in this embodiment the glass layer was coated to a thickness of 45 nm, that will introduce a phase shift of about 20 degrees. The film thickness should preferably be such as will make the phase shift less than 45 degrees.

After this, the substrate was subjected to five minutes of heat treatment at 80° C. in a convection-type oven. The conditions of heat treatment, such as temperature and time, are not limited to those mentioned above.

Figure 26:
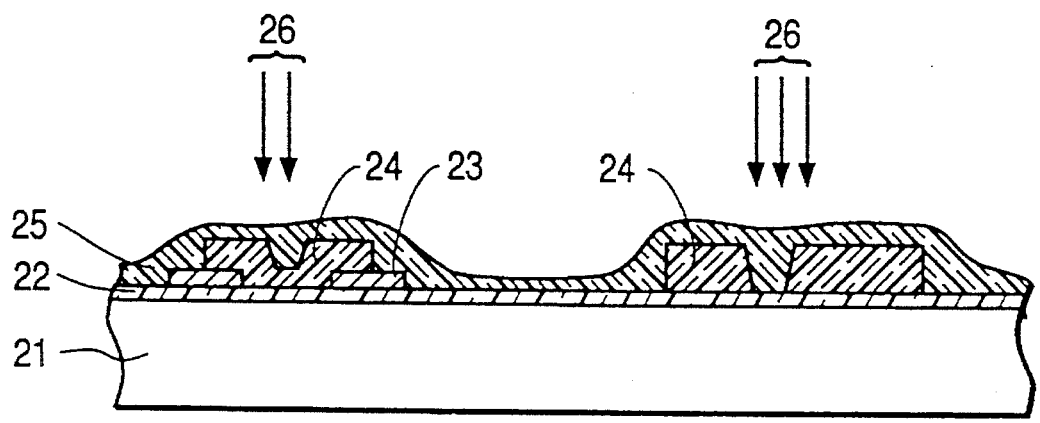
FIG. 26 is a schematic diagram showing a part of the process for fabricating a further embodiment of the phase-shifting mask according to this invention.
Figure 27:
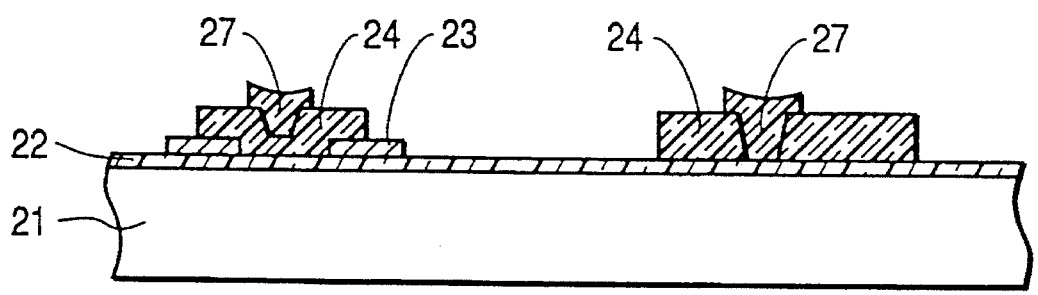
FIG. 27 is a schematic diagram showing a part of a cross-section of a further embodiment of the phase-shifting mask according to this invention.

Next, by using a direct electron beam exposure system with acceleration voltage of 30 kV, electron beams 26 were radiated against an area including a first phase shifter defect 28 and a second phase shifter 29 (FIG. 26). Then, the substrate was developed by methanol for 30 seconds and dried, and heat-treated at 200° C. for 30 seconds, thus forming a desired second phase shifter pattern 27 as shown in FIG. 27.

By using the phase-shifting mask whose defects were corrected as explained above and the reduction projection exposure equipment, a pattern transfer was done. The pattern transferred has good resolution without the phase shifter defects 28 and 29.

Embodiment 6

Now, a further embodiment of this invention will be described.

A phase-shifting mask for printing circuit patterns of a semiconductor device of 64-megabit DRAM (dynamic random access memory) class with the minimum design rule of 0.35 μm was fabricated by using a known method.

Figure 28:
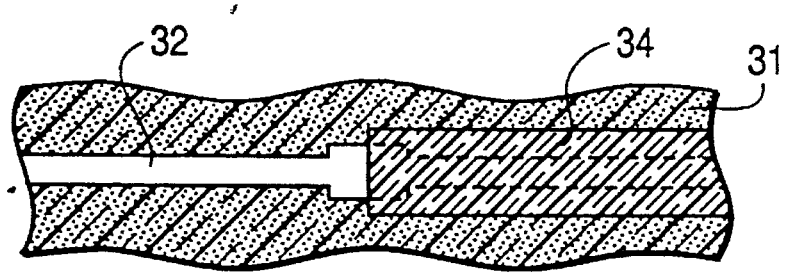
FIG. 28 is a schematic figure showing an embodiment of a mask according to this invention.
Figure 29:
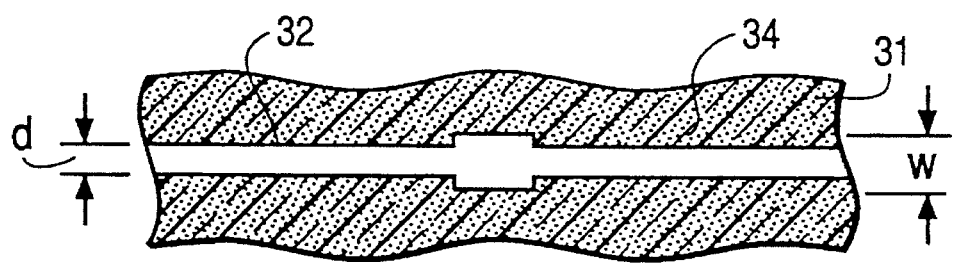
FIG. 29 is a schematic figure showing only a transparent pattern of the mask in the embodiment of the invention shown in FIG. 28.
Figure 30:
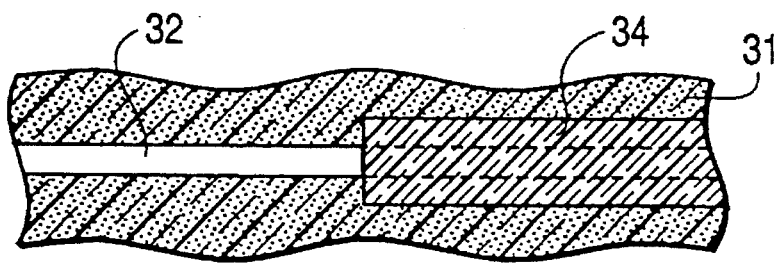
FIG. 30 is a schematic figure showing an example of a conventional mask.
Figure 43:
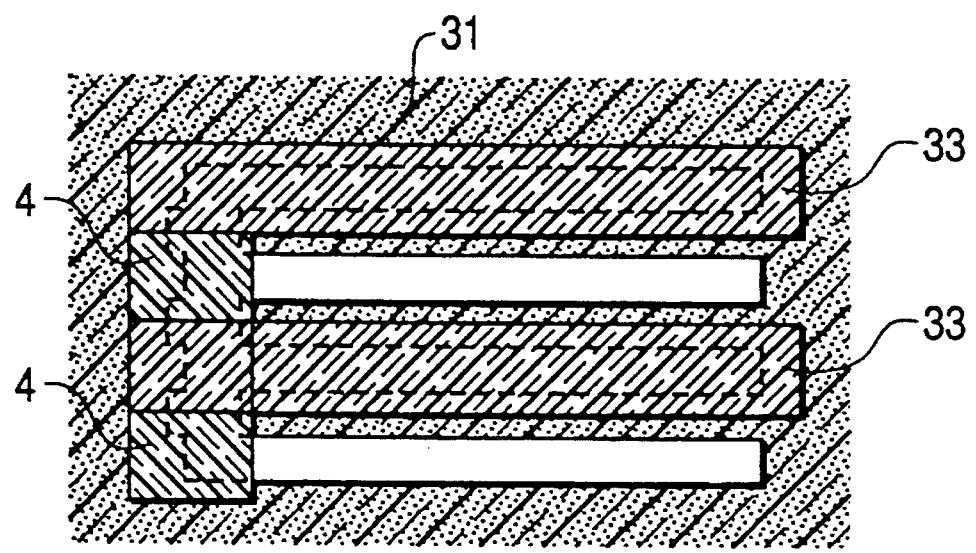
FIG. 43 is a schematic figure showing a further embodiment of the mask according to this invention.
Figure 44:
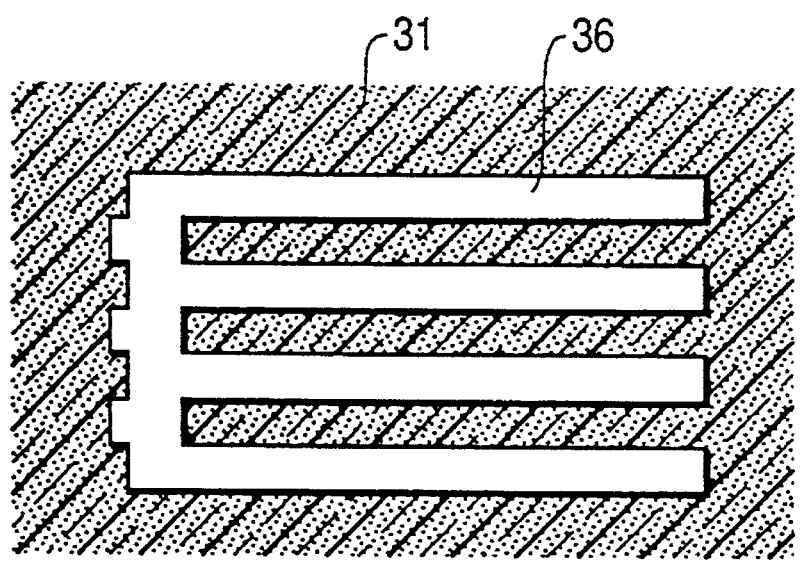
FIG. 44 is a schematic figure showing only a transparent pattern of the mask in the embodiment of the invention shown in FIG. 43.
Figure 50:
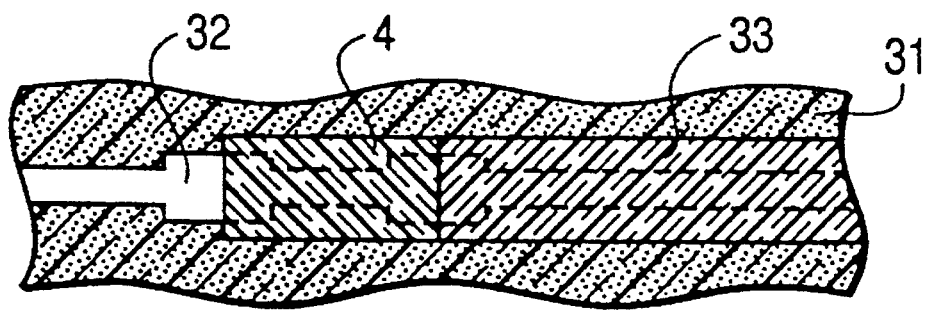
FIG. 50 is a schematic figure showing a further embodiment of the mask according to this invention.

FIGS. 28, 43 and 50 are schematic figures showing a part of the mask of this embodiment. FIG. 29 schematically shows only the transparent pattern of FIG. 28. FIG. 44 schematically shows only the transparent pattern of FIG. 43.

The first phase shifter 33 is provided to introduce a phase shift of about 180 degrees to the exposure light, the second phase shifter 4 90 degrees and the phase shifter 34 60 degrees.

While this embodiment introduces a phase shift of about 60 degrees by the phase shifter 34, the phase shift is not limited to this value. It is, however, noted that the interference effect of the exposure lights increases as the phase shift comes close to 180 degrees. Hence, the phase shift to be introduced should preferably be as small and apart from 180 degrees as possible.

In the mask pattern of FIG. 28, the size of the transparent pattern 32 at an area including the edge of the phase shifter 34 is set at w=0.55 μm, which is greater than the designed line pattern width of d=0.35 μm. The length of the area whose width is w=0.55 μm is set to 0.15 μm. Similarly, in the mask patterns of FIGS. 43 and 50, the size of the transparent pattern at an area including the two edges of the second phase shifter pattern 4 is increased in width by 0.2 μm.

How the pattern size is increased is not limited to the above example. It is noted that increasing the width and length of a portion of the transparent pattern too much results in an excessive widening of the light intensity distribution at this portion. It is therefore desired that the dimension of the expanded portion of the transparent pattern be set at an optimum value according to the width and shape of the transparent pattern and the phase shift of the exposure light introduced by the transparent film, and optical conditions of the exposing apparatus.

By using the phase-shifting mask fabricated as mentioned above, and an i-line (exposure light wavelength of 365 nm) reduction projection exposure system with reduction ratio of 5:1 which has a projection optical system with the numerical aperture of NA=0.52, a pattern was transferred with good resolution. Almost no constriction of the resist pattern was observed. In this manner, the breakdown of circuit patterns can be prevented.

Embodiment 7

A phase-shifting mask for printing circuit patterns of a semiconductor device of 64-megabit DRAM (dynamic random access memory) class with the minimum design rule of 0.35 μm was fabricated by using a known method.

Figure 31:
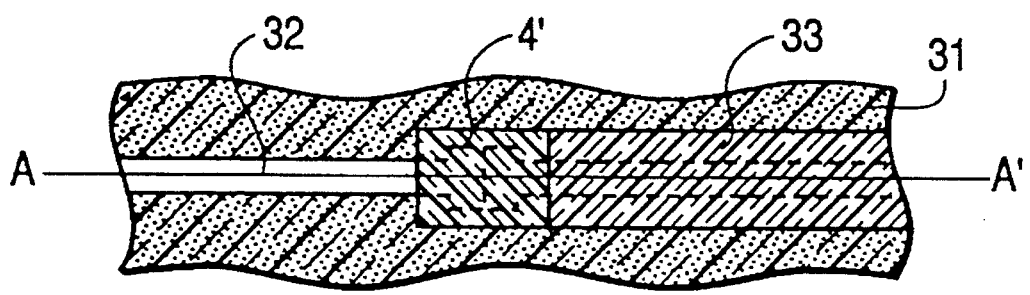
FIG. 31 is a schematic figure showing another embodiment of the mask according to this invention.
Figure 32:
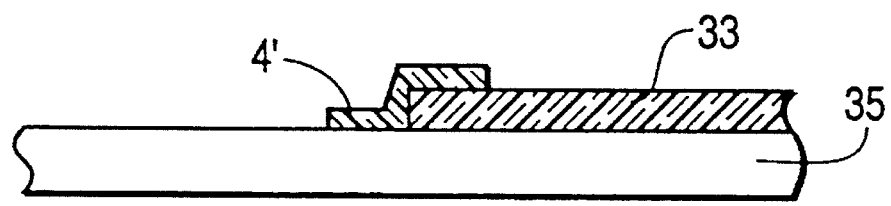
FIG. 32 is a schematic figure showing a cross-section of a part of the mask in the embodiment of this invention shown in FIG. 31.
Figure 33:
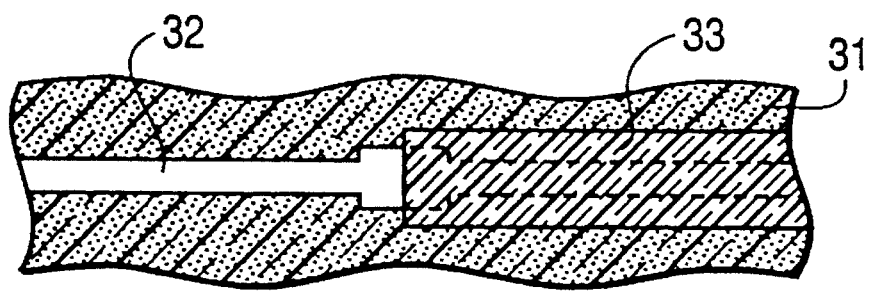
FIG. 33 is a schematic figure showing the mask of the embodiment of FIG. 31, with the second phase shifter pattern 4' removed.
Figure 34:
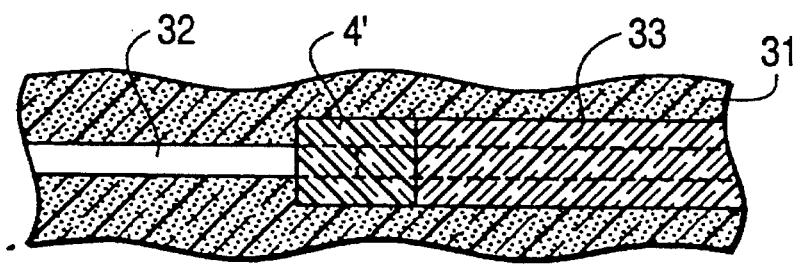
FIG. 34 is a schematic figure showing one example of the phase-shifting mask.
Figure 35:
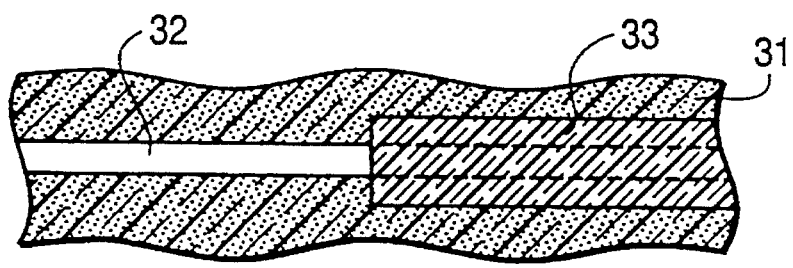
FIG. 35 is a schematic figure showing the phase-shifting of FIG. 34, with the second phase shifter pattern removed.
Figure 36:
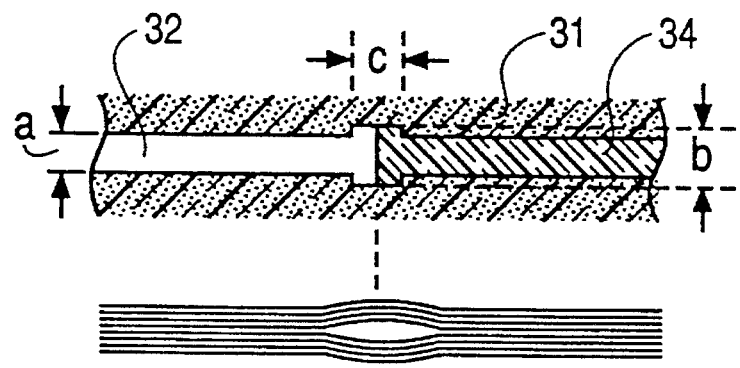
FIG. 36 is a schematic figure showing a light-intensity distribution on the substrate onto which the mask pattern is transferred, when the embodiment of the mask shown in FIG. 28 is used.
Figure 37:
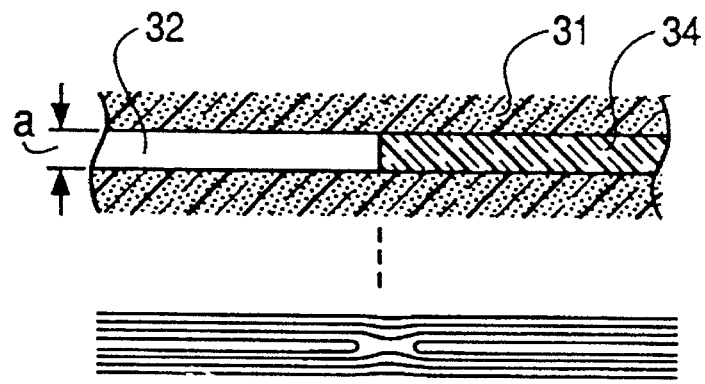
FIG. 37 is a schematic figure showing a light-intensity distribution on the substrate onto which the mask pattern is transferred, when an illustrative mask is used.
Figure 45:
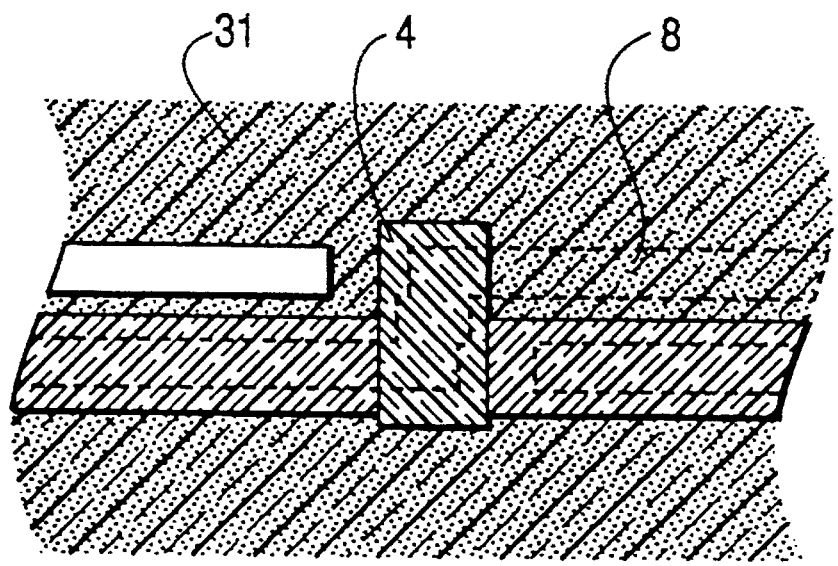
FIG. 45 is a schematic figure showing a further embodiment of the mask according to this invention.
Figure 46:
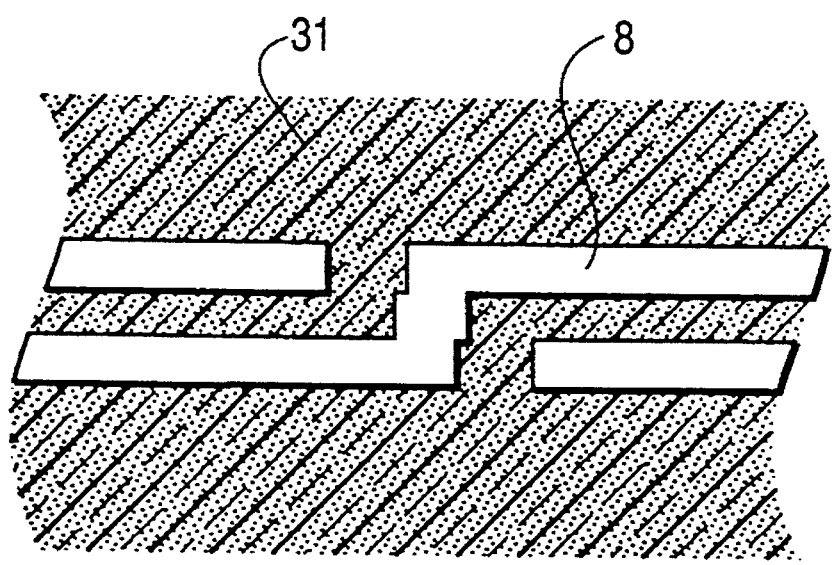
FIG. 46 is a schematic figure showing only a transparent pattern of the mask in the embodiment of the invention shown in FIG. 45.
Figure 47:
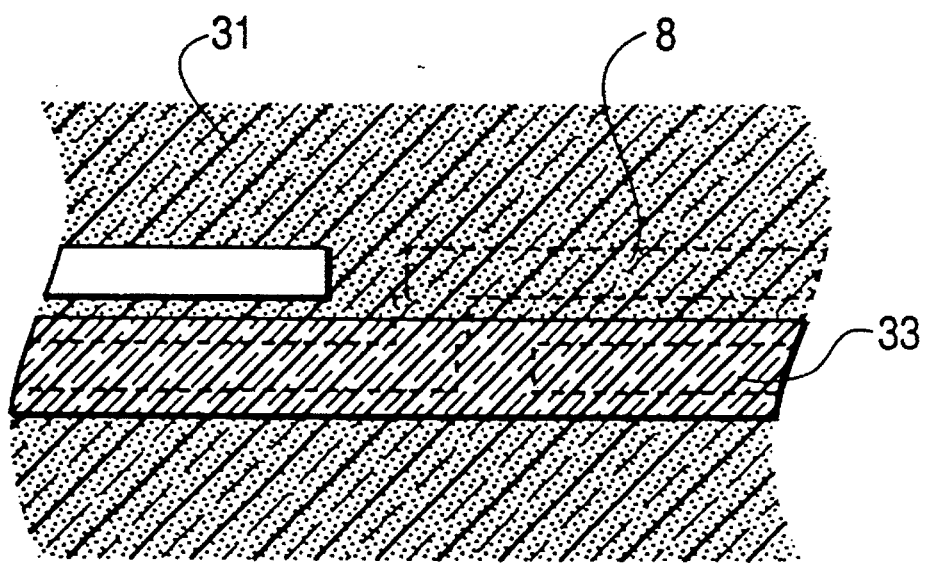
FIG. 47 is a schematic figure showing the mask of the embodiment shown in FIG. 45, with the second phase shifter pattern 4 removed.
Figure 48:
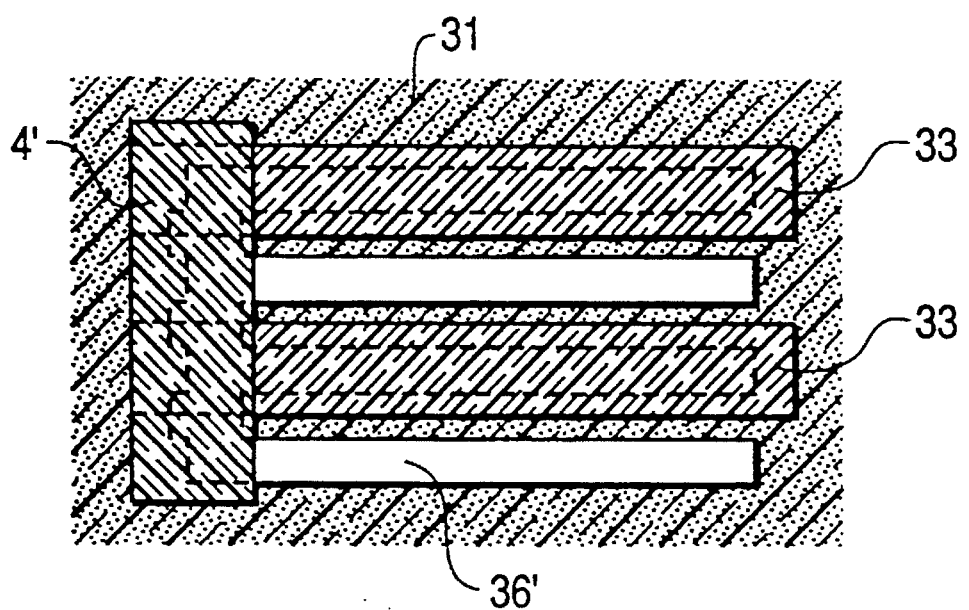
FIG. 48 is a schematic figure showing a further embodiment of the mask according to this invention.
Figure 49:
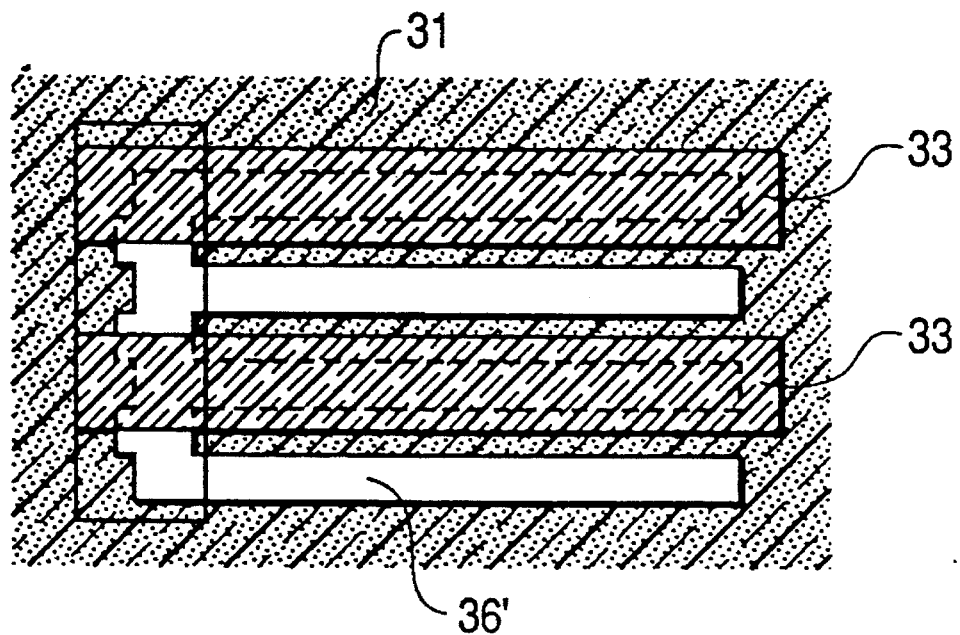
FIG. 49 is a schematic figure showing the mask of the embodiment shown in FIG. 48, with the second phase shifter pattern 4' removed.

FIGS. 31, 45 and 48 are schematic figures showing a part of the phase-shifting mask of this embodiment. FIG. 33 schematically shows the mask of FIG. 31, with the second phase shifter pattern removed. FIG. 46 schematically shows a transparent pattern 8 that forms a part of the mask pattern of FIG. 45. FIG. 47 schematically shows the mask pattern of FIG. 45, with the second phase shifter pattern 4 removed. FIG. 49 schematically shows the mask of FIG. 48, with the second phase shifter pattern 4' removed.

The phase shifter pattern 33 is formed to a thickness that will introduce a phase shift of about 180 degrees to the exposure light, and the phase shifter pattern 4 is formed to a thickness to introduce a phase shift of about 80 degrees.

In the mask of FIG. 31, the area of the transparent pattern including the edge of the phase shifter pattern 33 is made larger than the designed line pattern width. Similarly the mask patterns of FIGS. 45 and 48 have the area of the transparent pattern including the edge of the phase shifter pattern 33 increased.

It is desired that the dimension of the expanded portion of the transparent pattern be set at an optimum value according to the width and shape of the transparent pattern and the phase shift of the exposure light introduced by the transparent film, and optical conditions of the exposing apparatus.

By using the phase-shifting mask fabricated as mentioned above, and an i-line (exposure light wavelength of 365 nm) reduction projection exposure system with reduction ratio of 5:1, which has a projection optical system with the numerical aperture of NA=0.52, a pattern was transferred with good resolution. In this manner, the breakdown and narrowing of circuit patterns on the semiconductor device can be prevented.

Embodiment 8

A phase-shifting mask for printing circuit patterns of a semiconductor device of 256-megabit DRAM (dynamic random access memory) class with the minimum design rule of 0.2 μm was fabricated by using a known method.

Figure 38:
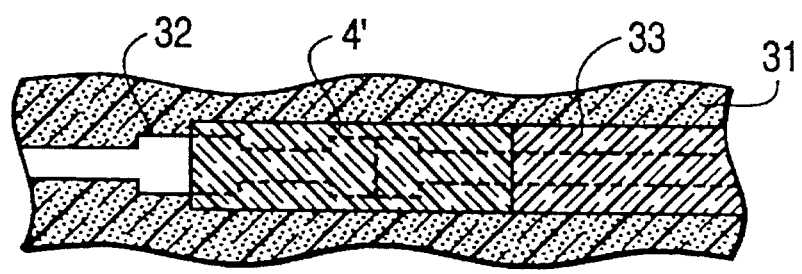
FIG. 38 is a schematic figure showing a further embodiment of the mask according to this invention.
Figure 39:
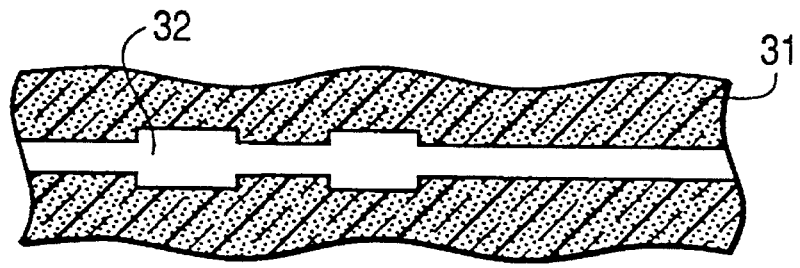
FIG. 39 is a schematic figure showing only a transparent pattern of the mask in the embodiment of the invention shown in FIG. 38.
Figure 40:
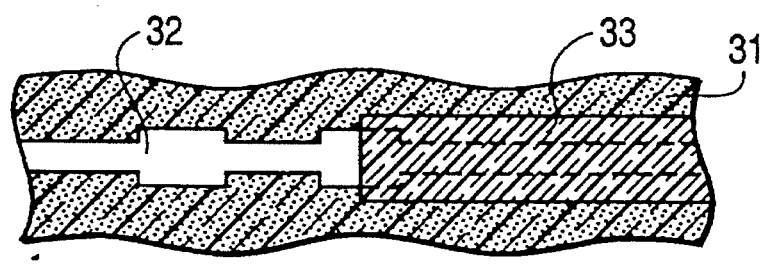
FIG. 40 is a schematic figure showing the mask of the embodiment shown in FIG. 38, with the second phase shifter pattern 4' removed.

FIG. 38 is a schematic figure showing a part of the mask of this embodiment. FIG. 39 schematically shows a transparent pattern 32 that forms a part of the mask pattern of FIG. 38. FIG. 40 schematically shows the mask pattern of FIG. 38, with the second phase shifter pattern 4' removed.

The phase shifter pattern 33 is formed to a thickness that will introduce a phase shift of about 180 degrees to the exposure light, and the phase shifter pattern 4' is formed to a thickness to introduce a phase shift of about 80 degrees.

In the mask shown in FIG. 38 the area of the transparent pattern including the edge of the phase shifter pattern 33 is set larger than the designed line pattern width, as shown in FIG. 39. FIG. 39 also shows that, of the areas of the transparent pattern including the edges of the second phase shifter pattern 4', the one in which the second phase shifter pattern 4' is not formed on the phase shifter pattern 33 is set larger than the designed line pattern width.

Figure 41:
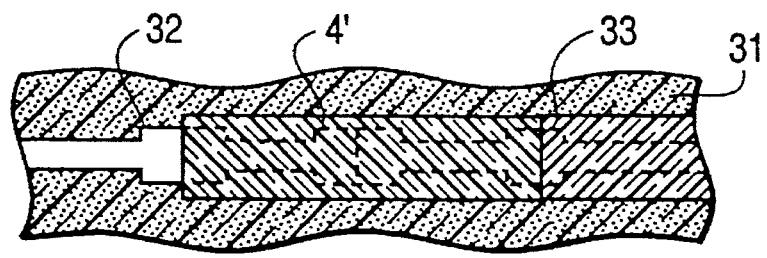
FIG. 41 is a schematic figure showing a further embodiment of the mask according to this invention.
Figure 42:
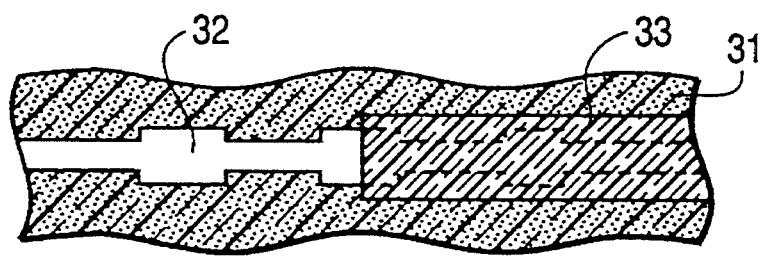
FIG. 42 is a schematic figure showing the mask of the embodiment shown in FIG. 41, with the second phase shifter pattern 4' removed.

While this embodiment changes the transparent pattern width as mentioned above, it is possible to set greater than the designed line pattern width the two areas of the transparent pattern including the edges of the second phase shifter pattern 4', as shown in FIG. 41. FIG. 42 schematically shows the mask of FIG. 41, with the second phase shifter pattern 4' removed.

Since the optimum width of the expanded portion of the transparent pattern changes according to the width and shape of the transparent pattern, the phase shift of the exposure light introduced by the transparent film, and the optical conditions of the exposing apparatus, these conditions should be considered in determining the optimum value.

By using the phase-shifting mask fabricated as mentioned above and a KrF excimer laser (exposure light wavelength of 248 nm) reduction projection exposure system with reduction ratio of 5:1, which has a projection optical system with the numerical aperture of NA=0.45, a pattern was transferred with good resolution. Almost no constriction was observed on the resist pattern.

With this invention, pattern defects such as break of pattern due to constriction of the resist pattern can be prevented. Further, with this invention, a phase shifter pattern with a plurality of phase shifts can be formed easily and with high precision.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A method of forming a pattern in a substrate, comprising the steps of:

positioning a phase-shifting mask having a pattern formed of light transmission regions, overlying a substrate, said phase-shifting mask having the light transmission regions, the light transmission regions having first parts with a first light phase shifting layer thereon and second parts without said first light phase shifting layer thereon, an edge being provided between the first and second parts of the light transmission regions, the first light phase shifting layer being provided such that the light passing through the first parts of the light transmission regions is shifted 180° in phase from light transmitted through the second parts, and further comprising second light phase shifting layers overlying said edge;

exposing the substrate to an exposure light through the phase-shifting mask, the exposure light passing through the light transmission region; and transferring the pattern to the substrate.

2. The method according to claim 1, wherein said substrate is a substrate for forming a semiconductor device.

3. The method according to claim 2, wherein said substrate is a semiconductor body having a photoresist film thereon, said pattern being transferred to the photoresist film.

4. The method according to claim 3, wherein said pattern is a wiring pattern of a circuit of the semiconductor device.

5. The method according to claim 1, wherein said substrate includes a resist film, the pattern being transferred to the resist film.

6. A method of forming a pattern in a substrate, comprising the steps of:

positioning a phase-shifting mask, having a pattern formed of light transmission regions, overlying a substrate, the phase-shifting mask having the light transmission regions, the light transmission regions including first parts and second parts, with light transmitted through the first and second parts being shifted in phase relative to each other, an edge being provided between the first and second parts, and further comprising a light phase shifting layer overlying said edge but not overlying an entirety of the first parts;

exposing the substrate to an exposure light through the phase-shifting mask, the exposure light passing through the light transmission regions; and transferring the pattern to the substrate.

7. The method according to claim 6, wherein said substrate includes a resist film, the pattern being transferred to the resist film.

8. The method according to claim 6, wherein the substrate is exposed using an i-line reduction projection exposure equipment.

9. The method according to claim 6, wherein the pattern is a wiring pattern of a large-scale integrated circuit, of a dynamic random access memory.

10. The method according to claim 6, wherein the substrate is exposed using a KrF excimer laser reduction projection exposure equipment.

11. The method of forming a pattern in a substrate, comprising the steps of:

positioning a phase-shifting mask, having a pattern formed of light transmission regions, overlying a substrate, the phase-shifting mask having the light transmission regions, the light transmission regions including first parts and second parts, with light passing through the first parts being shifted in phase relative to light passing through the second parts, edges being formed between adjacent first and second parts, the light transmission regions having a first width, and having a second width at locations including at said edges, and wherein said second width is greater than said first width;

exposing the substrate to an exposure light through the phase-shifting mask, the exposure light passing through the light transmission regions; and transferring the pattern to the substrate.

12. The method according to claim 11, wherein said substrate includes a resist film, the pattern being transferred to the resist film.

13. The method according to claim 11, wherein the substrate is exposed using an i-line reduction projection exposure equipment.

14. The method according to claim 11, wherein the pattern is a wiring pattern of a large-scale integrated circuit, of a dynamic random access memory.

15. The method according to claim 11, wherein the substrate is exposed using a KrF excimer laser reduction projection exposure equipment.

16. A method of forming a pattern in a substrate, comprising the steps of:

positioning a repaired phase-shifting mask, having a pattern formed of light transmission regions, overlying a substrate, the repaired phase-shifting mask having the light transmission regions, at least part of the light transmission regions having a first phase shifting layer thereon, the first phase shifting layer having at least one defect, said at least one defect including the absence of phase shifting layer material at a location such that there is a hole at said location, and a second phase shifting layer filling said hole, said second phase shifting layer having a thickness and refractive index such that light passing through said location is shifted in phase at most 90° relative to light passing through the first phase shifting layer;

exposing the substrate to an exposure light through the phase-shifting mask, the exposure light passing through the light transmission regions; and transferring the pattern to the substrate.

17. The method according to claim 16, wherein said substrate includes a resist film, the pattern being transferred to the resist film.

18. The method according to claim 16, wherein the substrate is exposed using an i-line reduction projection exposure equipment.

19. The method according to claim 16, wherein the pattern is a wiring pattern of a large-scale integrated circuit, of a dynamic random access memory.

20. The method according to claim 16, wherein the substrate is exposed using a KrF excimer laser reduction projection exposure equipment.

21. A method of forming a pattern in a substrate, comprising the steps of:

positioning a repaired phase-shifting mask, having a pattern formed of light transmission regions, overlying a substrate, the repaired phase-shifting mask having the light transmission regions, a part of the light transmission regions having a first phase shifting layer thereon, leaving a remaining part of the light transmission regions, the remaining part of the light transmission regions having an unwanted portion of the first phase shifting layer thereon, and a second phase shifting layer on the unwanted portion of the first phase shifting layer, the second phase shifting layer having a thickness and refractive index such that light passing through the second phase shifting layer and the unwanted portion of the first phase shifting layer is shifted substantially 270°–450°;

exposing the substrate to an exposure light through the phase-shifting mask, the exposure light passing through the light transmission regions; and transferring the pattern to the substrate.

22. The method according to claim 21, wherein said substrate includes a resist film, the pattern being transferred to the resist film.

23. The method according to claim 21, wherein the substrate is exposed using an i-line reduction projection exposure equipment.

24. The method according to claim 21, wherein the pattern is a wiring pattern of a large-scale integrated circuit, of a dynamic random access memory.

25. The method according to claim 21, wherein the substrate is exposed using a KrF excimer laser reduction projection exposure equipment.

* * * * *